US012805081B2

(12) United States Patent
Hashimoto et al.

(10) Patent No.: US 12,805,081 B2
(45) Date of Patent: Nov. 17, 2026

(54) LIGHT-EMITTING MODULE AND METHOD FOR MANUFACTURING LIGHT-EMITTING MODULE

(71) Applicant: NICHIA CORPORATION, Anan (JP)

(72) Inventors: Toru Hashimoto, Tokushima (JP); Yuki Shibutani, Komatsushima (JP); Masaya Miyazaki, Tokushima (JP); Masato Tanabe, Itano-gun (JP)

(73) Assignee: NICHIA CORPORATION, Anan (JP)

( * ) Notice: Subject to any disclaimer, the term of this patent is extended or adjusted under 35 U.S.C. 154(b) by 604 days.

(21) Appl. No.: 18/319,190

(22) Filed: May 17, 2023

(65) Prior Publication Data

US 2023/0378407 A1 Nov. 23, 2023

(30) Foreign Application Priority Data

May 17, 2022 (JP) ................................ 2022-080603
Aug. 18, 2022 (JP) ................................ 2022-130463
Nov. 28, 2022 (JP) ................................ 2022-188865

(51) Int. Cl.
*H10H 20/856* (2025.01)
*H10H 20/01* (2025.01)

(52) U.S. Cl.
CPC ....... *H10H 20/856* (2025.01); *H10H 20/0363* (2025.01)

(58) Field of Classification Search
CPC .. G02B 6/0021; G02B 6/0073; G02B 6/0068; G02B 6/0031; G02B 6/0055;
(Continued)

(56) References Cited

U.S. PATENT DOCUMENTS

2009/0003002 A1 * 1/2009 Sato .................... G02B 6/0061 362/341
2012/0218752 A1 8/2012 Sumitani
(Continued)

FOREIGN PATENT DOCUMENTS

JP 2003347734 A * 12/2003
JP 2012174634 A 9/2012
(Continued)

OTHER PUBLICATIONS

Eguchi, "English Translation of JP2003347734A", 2003 (Year: 2003).*
(Continued)

*Primary Examiner* — Kretelia Graham
*Assistant Examiner* — Hamna Fathima Iqbal
(74) *Attorney, Agent, or Firm* — Hunton Andrews Kurth LLP

(57) ABSTRACT

A light-emitting module includes a light source part, a light-transmitting member including a first light-transmitting part and a second light-transmitting part, the second light-transmitting part is positioned at an upper side of the light source part and the first light-transmitting part, and a light-adjusting member located at an upper side of the light source part, the first light-transmitting part, and the second light-transmitting part, wherein the first light-transmitting part contacts a lateral surface of the light source part, the light-adjusting member includes a through-hole positioned away from the light source part in a plan view, the light-transmitting member includes a recess communicating with the through-hole, and at least a portion of the recess is positioned lower than a lower surface of the light-adjusting member.

12 Claims, 22 Drawing Sheets

(58) Field of Classification Search
CPC .. G02B 6/0023; G02B 6/0016; G02B 6/0036; G02B 6/0065; G02B 6/0043; G02B 6/0038; G02B 6/0091; G02B 6/005; G02B 6/0018; G02B 6/002; G02B 6/0053; G02B 6/0088; G02B 6/0028; G02B 6/0045; G02B 6/0035; G02B 6/0221; G02B 5/0221; G02B 5/0231; G02B 27/0977; H10H 20/856; H10H 20/0363; H10H 20/855
See application file for complete search history.

(56) References Cited

U.S. PATENT DOCUMENTS

| | | | | |
|---|---|---|---|---|
| 2016/0085011 | A1* | 3/2016 | Lancashire .......... | G02B 6/0001<br>362/326 |
| 2018/0335559 | A1* | 11/2018 | Cho ..................... | G02B 6/0091 |
| 2019/0094618 | A1 | 3/2019 | Kyoukane et al. | |
| 2019/0265549 | A1 | 8/2019 | Chen et al. | |
| 2020/0089051 | A1* | 3/2020 | Watanabe ......... | G02F 1/133553 |
| 2021/0247051 | A1* | 8/2021 | Nakabayashi ....... | G02B 6/0021 |
| 2021/0397049 | A1 | 12/2021 | Allen et al. | |
| 2022/0026043 | A1* | 1/2022 | Iwakura .................. | F21V 5/043 |
| 2022/0075111 | A1 | 3/2022 | Yamashita et al. | |
| 2022/0099879 | A1 | 3/2022 | Emura | |

FOREIGN PATENT DOCUMENTS

| | | | |
|---|---|---|---|
| JP | 2013145765 | A | 7/2013 |
| JP | 2019061929 | A | 4/2019 |
| JP | 2019530967 | A | 10/2019 |
| JP | 2021125455 | A | 8/2021 |
| JP | 2022021300 | A | 2/2022 |
| JP | 2022513014 | A | 2/2022 |
| JP | 2022044482 | A | 3/2022 |
| JP | 2022057035 | A | 4/2022 |
| KR | 101985148 | B1 | 5/2019 |
| WO | WO2016121197 | A1 * | 8/2016 |
| WO | 2020101038 | A1 | 5/2020 |

OTHER PUBLICATIONS

Wagatsuma et al., "English Translation of WO2016121197A1", 2016 (Year: 2016).*

* cited by examiner

LIGHT-EMITTING MODULE AND METHOD FOR MANUFACTURING LIGHT-EMITTING MODULE

CROSS-REFERENCE TO RELATED APPLICATIONS

This application is based upon and claims priority to Japanese Patent Application No. 2022-080603, filed on May 17, 2022, the entire contents of which are incorporated herein by reference.

This application is based upon and claims priority to Japanese Patent Application No. 2022-130463, filed on Aug. 18, 2022, the entire contents of which are incorporated herein by reference.

This application is based upon and claims priority to Japanese Patent Application No. 2022-188865, filed on Nov. 28, 2022, the entire contents of which are incorporated herein by reference.

FIELD

Embodiments described herein relate generally to a light-emitting module and a method for manufacturing a light-emitting module.

BACKGROUND

Light-emitting modules that combine a light guide member and a light-emitting element such as a light-emitting diode or the like are widely utilized in, for example, planar light sources such as backlights of liquid crystal displays, etc. For example, Japanese Patent Publication No. 2019-61929 discusses a backlight device that includes an LED substrate including a reflective sheet and multiple light-emitting diodes, and a diffusion plate facing the LED substrate.

SUMMARY

A light-emitting module according to an aspect of the invention includes a light source part, a light-transmitting member including first and second light-transmitting parts, and a light-adjusting member located at an upper side of the light source part, the first light-transmitting part, and the second light-transmitting part, wherein the first light-transmitting part contacts a lateral surface of the light source part, the second light-transmitting part is positioned at an upper side of the light source part and the first light-transmitting part, the light-adjusting member includes a through-hole positioned away from the light source part in a plan view, the light-transmitting member includes a recess communicating with the through-hole, and at least a portion of the recess is positioned lower than a lower surface of the light-adjusting member.

According to an aspect of the invention, a method for manufacturing a light-emitting module includes, in order, a process of providing an intermediate body including a light source part, a light-transmitting member, and a light-adjusting member positioned at an upper side of the light source part and the light-transmitting member, and a process of forming a through-hole in the light-adjusting member, wherein the light-transmitting member contacts a lateral surface of the light source part, and the through-hole is positioned away from the light source part in a plan view.

DETAILED DESCRIPTION

Figure 1:
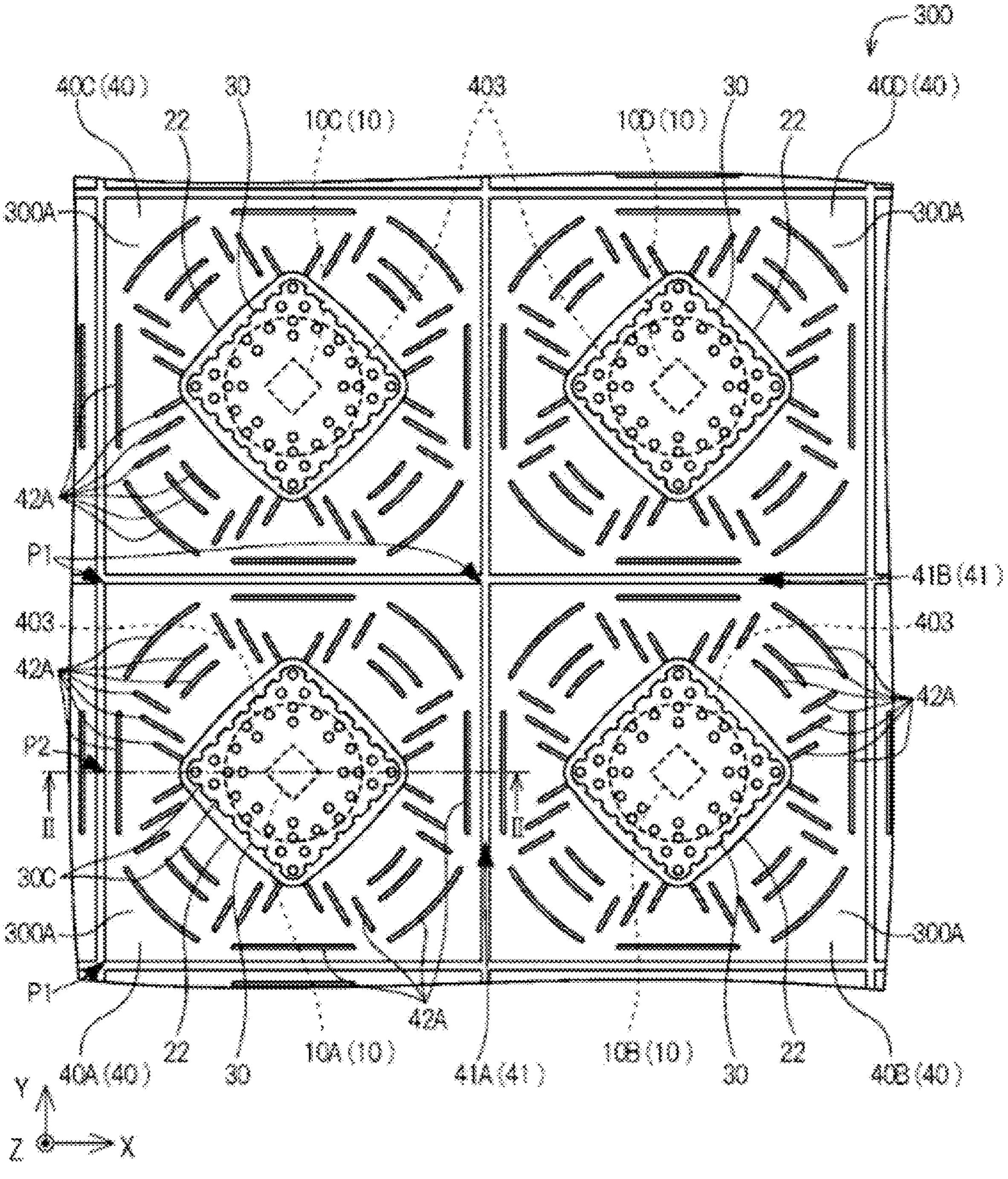
FIG. 1 is a schematic plan view of a planar light source according to the embodiment.

Embodiments will now be described with reference to the drawings. Because the drawings schematically show embodiments, the scales, spacing, positional relationships, and the like of the members may be exaggerated, or some of the members may not be illustrated. In the specification, the arrow direction of a Z-axis is taken as up, and the direction at the side opposite to the arrow direction of the Z-axis is taken as down. End views that show only cross sections may be used as cross-sectional views.

In the following description, components that have substantially the same function may be shown using common reference numerals; and a description may be omitted. Terms that indicate specific directions or positions (e.g., "up", "down", and other terms including such terms) may be used. Such terms, however, are used merely for better understanding of relative directions or positions when referring to the drawings. As long as the relationships are the same, the relative directions or positions according to terms such as "up", "down", etc., used when referring to the drawings may not have the same arrangements in drawings, actual products, and the like outside the disclosure. In the specification, "parallel" includes not only the case where two straight lines, sides, surfaces, or the like do not cross even when extended, but also the case where the angle between two straight lines, sides, surfaces, or the like is within 10°. The positional relationship referred to as "on", "above", and "upper side" in the specification includes the case of being in contact and the case of being positioned above without contact.

Embodiments

A light-emitting module 100 and a planar light source 300 of the embodiment will now be described with reference to FIGS. 1 to 6B. FIG. 1 illustrates the light-emitting surface of the planar light source 300 in a plan view. Two mutually-orthogonal directions parallel to the light-emitting surface of the planar light source 300 are taken as a first direction and a second direction. A direction orthogonal to the first and second directions is taken as a third direction. In FIG. 1, the first direction is an X-direction; the second direction is a Y-direction; and the third direction is a Z-direction. In the specification, a plane parallel to the first direction (the X-direction) and the second direction (the Y-direction) may be referred to as the XY plane. Directions at angles from the first direction (the X-direction) of not less than 0° but less than 360° in the XY plane may be referred to as lateral directions; and the third direction (the Z-direction) may be referred to as the vertical direction.

The planar light source 300 includes the light-emitting module 100 and a support member 200. The light-emitting module 100 is located on the support member 200. The light-emitting module 100 includes a light source part 10, a light-transmitting member 20, and a light-adjusting member 30. The light-transmitting member 20 includes a first light-transmitting part 21 and a second light-transmitting part 22. The first light-transmitting part 21 contacts the lateral surface of the light source part 10. The second light-transmitting part 22 is positioned at the upper side of the light source part 10. The second light-transmitting part 22 is positioned at the upper side of the first light-transmitting part 21. The light-adjusting member 30 is located at the upper side of the light source part 10. The light-adjusting member 30 is located at the upper side of the first light-transmitting part 21. The light-adjusting member 30 is located at the upper side of the second light-transmitting part 22. The light-adjusting member 30 includes a through-hole 30A. The through-hole 30A of the light-adjusting member 30 is positioned away from the light source part 10 in a plan view. The light-transmitting member 20 includes a recess 20A. The recess 20A of the light-transmitting member 20 communicates with the through-hole 30A. At least a portion of the recess 20A of the light-transmitting member 20 is positioned lower than the lower surface of the light-adjusting member 30.

Because the light-adjusting member 30 is positioned at the upper side of the light source part 10, the region directly above the light source part 10 can be prevented from being too bright. Uneven luminance of the light-emitting module 100 is reduced thereby.

Components included in the light-emitting module 100 and the planar light source 300 will now be elaborated.

Light Source Part 10

As shown in FIG. 1, the light-emitting module 100 includes multiple light source parts 10 including a first light source 10A, a second light source 10B, a third light source 10C, and a fourth light source 10D. The quantity of the light source parts 10 included in the light-emitting module 100 may be one.

Figure 3A:
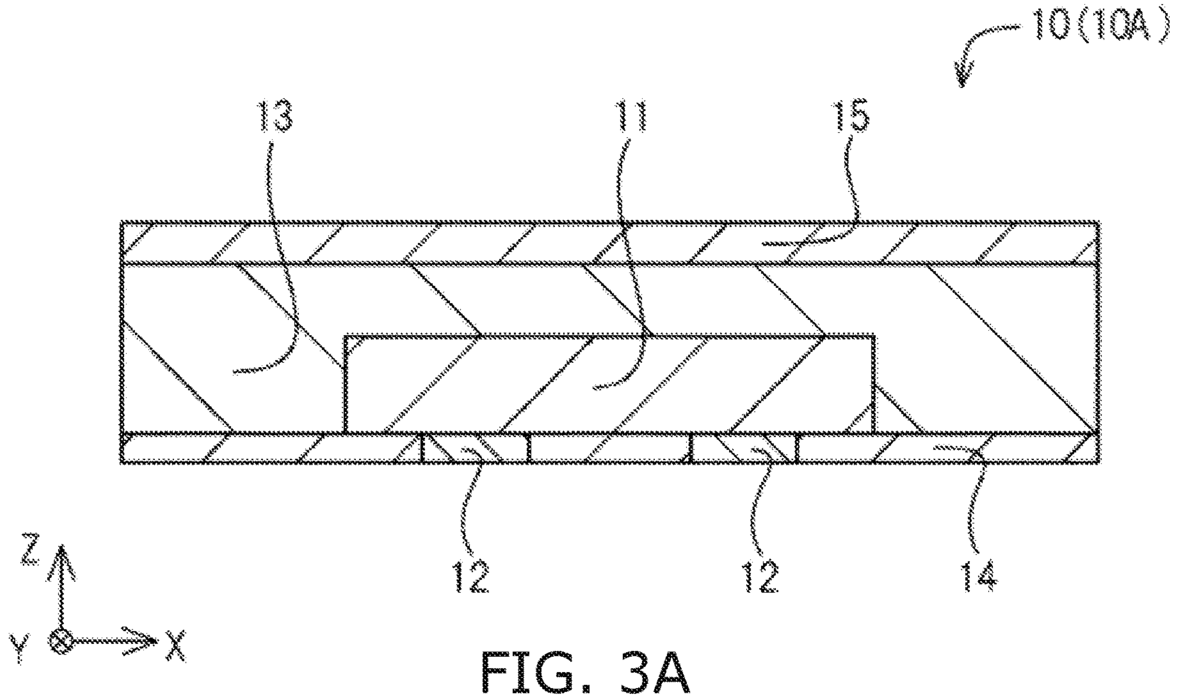
FIG. 3A is a schematic cross-sectional view of a light source part according to the embodiment.

As shown in FIG. 3A, the light source part 10 includes a light-emitting element 11. The light-emitting element 11 includes a semiconductor stacked body. The semiconductor stacked body includes, for example, a substrate of sapphire, gallium nitride, or the like, an n-type semiconductor layer and a p-type semiconductor layer located on the substrate, and a light-emitting layer interposed between the n-type semiconductor layer and the p-type semiconductor layer. The light-emitting element 11 includes an n-side electrode electrically connected with the n-type semiconductor layer, and a p-side electrode electrically connected with the p-type semiconductor layer. The n-side electrode and the p-side electrode are included in portions of the lower surface of the light-emitting element 11. The light source part 10 further includes a pair of positive and negative electrodes 12. The pair of positive and negative electrodes 12 is included in portions of the lower surface of the light source part 10. One of the pair of electrodes 12 is electrically connected with the p-side electrode; and the other of the pair of electrodes 12 is electrically connected with the n-side electrode. The light source part 10 may not include the electrodes 12. When the light source part 10 does not include the pair of positive and negative electrodes 12, the n-side electrode and the p-side electrode of the light-emitting element 11 are included in portions of the lower surface of the light source part 10. Also, the light source part 10 may not include the substrate. Thereby, the light source part 10 is more easily downsized in the third direction (the Z-direction).

The structure of the light-emitting layer may be a structure that has a single active layer such as a double hetero structure or single quantum well structure (SQW), or may be a structure that has one active layer group such as a multi-quantum well structure (MQW). The light-emitting layer can emit visible light or ultraviolet light. The light-emitting layer can emit blue to red light as the visible light. A semiconductor stacked body including such a light-emitting layer can include, for example, $In_xAl_yGa_{1-x-y}N$ ($0\leq x$, $0\leq y$, and $x+y\leq 1$). The semiconductor stacked body can include at least one light-emitting layer capable of the light emission described above. For example, the semiconductor stacked body may have a structure that includes at least one light-emitting layer between the n-type semiconductor layer and the p-type semiconductor layer, or may have a configuration in which a structure including the n-type semiconductor layer, the light-emitting layer, and the p-type semiconductor layer in this order is repeated multiple times. When the semiconductor stacked body includes multiple light-emitting layers, light-emitting layers of different light emission peak wavelengths may be included, or light-emitting layers of the same light emission peak wavelength may be included. For example, the light emission peak wavelength being the same means that there may be variation of about several nm. A combination of such light-emitting layers can be selected as appropriate; for example, when the semiconductor stacked body includes two light-emitting layers, the light-emitting layer can be selected to have combinations such as blue light and blue light, green light and green light, red light and red light, ultraviolet light and ultraviolet light, blue light and green light, blue light and red light, green light and red light, etc. Also, the light-emitting layer may include multiple active layers of different light emission peak wavelengths, or may include multiple active layers of the same light emission peak wavelength.

The light source part 10 shown in FIG. 3A includes one light-emitting element 11. Each light source part 10 of the first light source 10A, the second light source 10B, the third light source 10C, the fourth light source 10D, etc., may include multiple light-emitting elements 11. The light emission peak wavelengths of the multiple light-emitting elements included in each light source part 10 may be the same or different. For example, when each light source part 10 includes two light-emitting elements, the light emission peak wavelengths of the light-emitting elements can be selected to have combinations such as blue light and green light, blue light and red light, ultraviolet light and blue light, ultraviolet light and green light, ultraviolet light and red light, green light and red light, etc. For example, when each light source part 10 includes three light-emitting elements, the light emission peak wavelengths of the light-emitting elements can be selected to have combinations such as blue light, green light, and red light, ultraviolet light, green light, and red light, ultraviolet light, blue light, and green light, ultraviolet light, blue light, and red light, ultraviolet light, green light, and red light, etc.

As shown in FIG. 3A, the light source part 10 can further include a light-transmitting member 13 (hereinbelow, referred to as the light source light-transmitting member). The light source light-transmitting member 13 covers the upper surface and the lateral surface of the light-emitting element 11. The light-emitting element 11 can be protected by the light source light-transmitting member 13. The light source light-transmitting member 13 may be located so that at least a portion of the upper surface of the light-emitting element 11 is exposed. Thereby, the light source part 10 is more easily downsized in the third direction (the Z-direction).

For example, the light source light-transmitting member 13 is transmissive to the light emitted by the light-emitting element 11. The light source light-transmitting member 13 may include a light-transmitting resin, and may further include a phosphor. For example, a silicone resin, an epoxy resin, or the like can be used as the light-transmitting resin. An yttrium-aluminum-garnet-based phosphor (e.g., $(Y, Gd)_3(Al, Ga)_5O_{12}:Ce$), a lutetium-aluminum-garnet-based phosphor (e.g., $Lu_3(Al, Ga)_5O_{12}:Ce$), a terbium-aluminum-garnet-based phosphor (e.g., $Tb_3(Al, Ga)_5O_{12}:Ce$), a CCA-based phosphor (e.g., $Ca_{10}(PO_4)_6Cl_2:Eu$), an SAE-based phosphor (e.g., $Sr_4Al_{14}O_{25}:Eu$), a chlorosilicate-based phosphor (e.g., $Ca_8MgSi_4O_{16}Cl_2:Eu$), a silicate-based phosphor (e.g., $(Ba, Sr, Ca, Mg)_2SiO_4:Eu$), an oxynitride-based phosphor such as a β-sialon-based phosphor (e.g., $(Si, Al)_3(O, N)_4:Eu$), an α-sialon-based phosphor (e.g., $Ca(Si, Al)_{12}(O, N)_{16}:Eu$), or the like, a nitride-based phosphor such as an LSN-based phosphor (e.g., $(La, Y)_3Si_6N_{11}:Ce$), a BSESN-based phosphor (e.g., $(Ba, Sr)_2Si_5N_8:Eu$), an SLA-based phosphor (e.g., $SrLiAl_3N_4:Eu$), a CASN-based phosphor (e.g., $CaAlSiN_3:Eu$), a SCASN-based phosphor (e.g., $(Sr, Ca)AlSiN_3:Eu$), or the like, a fluoride-based phosphor such as a KSF-based phosphor (e.g., $K_2SiF_6:Mn$), a KSAF-based phosphor (e.g., $K_2(Si_{1-x}Al_x)F_{6-x}:Mn$, where x satisfies $0<x<1$), a MGF-based phosphor (e.g., $3.5MgO\cdot 0.5MgF_2\cdot GeO_2:Mn$), or the like, a quantum dot having a perovskite structure (e.g., $(Cs, FA, MA)(Pb, Sn)(F, Cl, Br, I)_3$, where FA and MA are respectively formamidinium and methylammonium), a Group II-VI quantum dot (e.g., CdSe), a Group III-V quantum dot (e.g., InP), a quantum dot having a chalcopyrite structure (e.g., $(Ag, Cu)(In, Ga)(S, Se)_2$), etc., can be used as the phosphor. One type of phosphor or multiple types of phosphors may be used as the phosphor added to the light source light-transmitting member 13.

A wavelength conversion sheet that contains the phosphor described above may be located on the planar light source 300. The planar light source can emit white light by the wavelength conversion sheet absorbing a portion of the blue light from the light source part 10 and emitting yellow light, green light, and/or red light. For example, white light can be obtained by combining the light source part 10 capable of a blue light emission and a wavelength conversion sheet containing a phosphor capable of a yellow light emission. Also, the light source part 10 that is capable of a blue light emission and a wavelength conversion sheet that contains a red phosphor and a green phosphor may be combined. The light source part 10 that is capable of a blue light emission and multiple wavelength conversion sheets may be combined. For example, a wavelength conversion sheet that contains a phosphor capable of a red light emission and a wavelength conversion sheet that contains a phosphor capable of a green light emission can be selected as the multiple wavelength conversion sheets. The light source part 10 that contains the light-emitting element 11 capable of a blue light emission and the light source light-transmitting member 13 containing a phosphor capable of a red light emission may be combined with a wavelength conversion sheet that contains a phosphor capable of a green light emission.

For example, it is preferable to use the yttrium-aluminum-garnet-based phosphor described above as a phosphor capable of a yellow light emission used in the wavelength conversion sheet. For example, it is preferable to use the quantum dot having the perovskite structure, the Group III-V quantum dot, or the quantum dot having the chalcopyrite structure described above, which have narrow light emission peak wavelength widths at half maximum, as a phosphor capable of a green light emission used in the wavelength conversion sheet. For example, it is preferable to use the KSF-based phosphor, the KSAF-based phosphor, the Group III-V quantum dot, or the quantum dot phosphor having the chalcopyrite structure described above, which have narrow light emission peak wavelength widths at half maximum similarly to the phosphor capable of a green light emission, as a phosphor capable of a red light emission used in the wavelength conversion sheet.

The light source part 10 can further include a cover member 14. The cover member 14 is located at the lower surface of the light-emitting element 11. The cover member 14 is located so that the lower surfaces of the electrodes 12 of the light source part 10 are exposed from the cover member 14. The cover member 14 also is located at the lower surface of the light source light-transmitting member 13 covering the lateral surface of the light-emitting element 11.

The cover member 14 is reflective to the light emitted by the light-emitting element 11. The cover member 14 can include, for example, a resin member that contains light-scattering particles. For example, a thermoplastic resin such as an acrylic resin, a polycarbonate resin, a cyclic polyolefin resin, a polyethylene terephthalate resin, a polyester resin, or the like, or a thermosetting resin such as an epoxy resin, a silicone resin, or the like can be used as the resin member of the cover member 14. For example, particles of titania, silica, alumina, zinc oxide, magnesium oxide, zirconia, yttria, calcium fluoride, magnesium fluoride, niobium pentoxide, barium titanate, tantalum pentoxide, barium sulfate, glass, etc., can be used as the light-scattering particles of the cover member 14.

As shown in FIG. 3A, the light source part 10 can include a light-adjusting member 15 (hereinbelow, referred to as the light source light-adjusting member). The light source light-adjusting member 15 is included in at least a portion of the upper surface of the light source part 10. The light source light-adjusting member 15 is located at the upper side of the light-emitting element 11. The light source light-adjusting member 15 and the light-emitting element 11 overlap in a plan view; and the light source light-adjusting member 15 is positioned at the upper side of the light-emitting element 11 at the overlapping portion. The light source light-adjusting member 15 is located at the upper side of the light source light-transmitting member 13 and adjusts the amount and/or emission direction of the light emitted from the upper surface of the light source light-transmitting member 13. The light source light-adjusting member 15 is reflective and transmissive to the light emitted by the light-emitting element 11. A portion of the light emitted from the upper surface of the light source light-transmitting member 13 is reflected by the light source light-adjusting member 15; and another portion of the light passes through the light source light-adjusting member 15. It is preferable for the transmittance of the light source light-adjusting member 15 for the peak wavelength of the light-emitting element 11 to be, for example, not less than 1% and not more than 50%, and more favorably not less than 3% and not more than 30%. By the light source part 10 including the light source light-adjusting member 15, the region directly above the light source part 10 can be prevented from being too bright. The uneven luminance of the light-emitting module 100 is reduced thereby.

The light source light-adjusting member 15 can include, for example, a resin member that contains light-scattering particles. A material similar to the resin member of the cover member 14 can be used as the resin member of the light source light-adjusting member 15. A material similar to the light-scattering particles of the cover member 14 can be used as the light-scattering particles of the light source light-adjusting member 15. The light source light-adjusting member 15 may be, for example, a dielectric multilayer film or a metal member of aluminum, silver, etc.

Figure 3B:
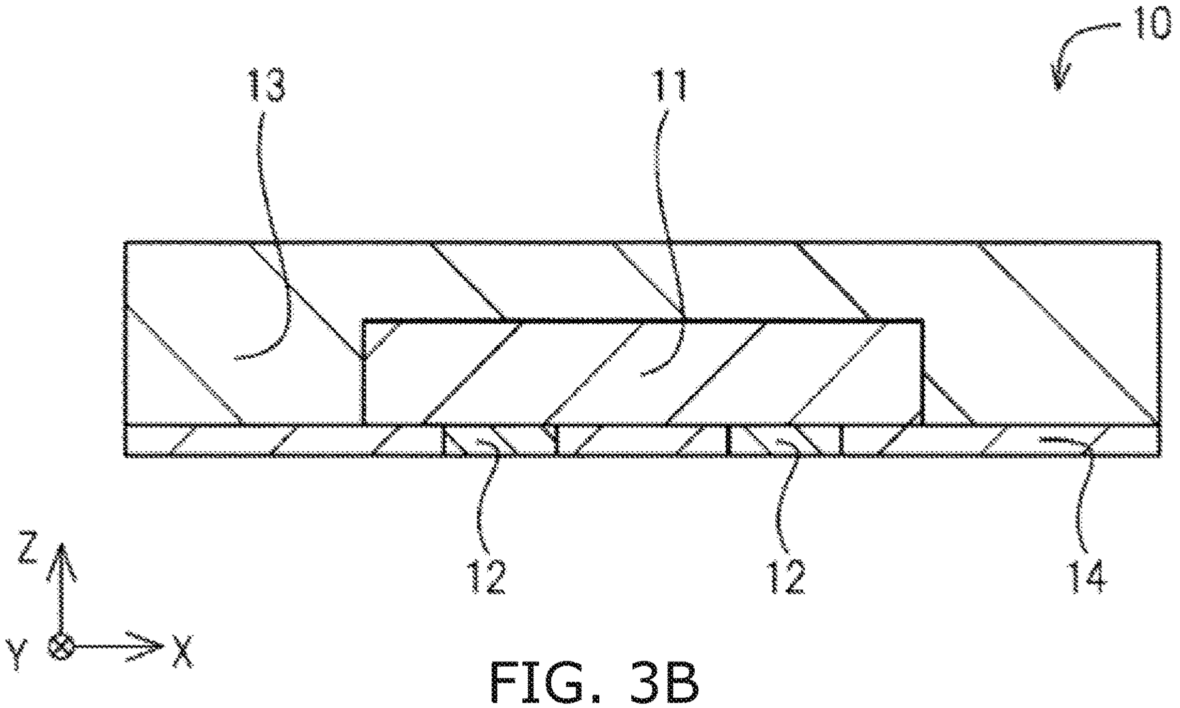
FIG. 3B is a schematic cross-sectional view of a modification of the light source part according to the embodiment.

As shown in FIG. 3B, the light source part 10 may not contain the light source light-adjusting member 15. Thereby, the light source part 10 is more easily downsized in the third direction (the Z-direction) as compared to the case in which the light source part 10 includes the light source light-adjusting member 15 located at the upper side of the light-emitting element 11. As another configuration of the light source part 10, the light source part 10 may not include the cover member 14. For example, the lower surface of the light source part may include the lower surface of the light-emitting element, the lower surfaces of the pair of electrodes 12, and the lower surface of the light source light-transmitting member. As another configuration of the light source part 10, the light source part 10 may be only the light-emitting element 11 alone. As another configuration of the light source part 10, the light source part 10 may not include the cover member 14 and the light source light-transmitting member 13; and the light source light-adjusting member 15 may be located at the upper surface of the light-emitting element 11. As another configuration of the light source part 10, the light source part 10 may not include the light source light-transmitting member 13; the light source light-adjusting member 15 may be located at the upper surface of the light-emitting element 11; and the cover member 14 may be located at the lower surface of the light-emitting element 11.

The shape of the light source part 10 in a plan view is not particularly limited. The shape of the light source part 10 in a plan view can be, for example, circular, triangular, quadrilateral, hexagonal, octagonal, etc. When the shape of the light source part 10 in a plan view is quadrilateral, a pair of outer edges of the light source part 10 may be parallel to the first direction (the X-direction) or may be oblique to the first direction (the X-direction). According to the embodiment, the pair of outer edges of the light source part 10 is rotated 45° with respect to the first direction (the X-direction).

Light-Transmitting Member 20

The light-transmitting member 20 is a member that is transmissive to the light emitted by the light source part 10. The light-transmitting member 20 includes the first light-transmitting part 21 and the second light-transmitting part 22. According to the embodiment, the first light-transmitting part 21 and the second light-transmitting part 22 are separate bodies. The first light-transmitting part 21 and the second light-transmitting part 22 may be formed to have a monolithic body of the same material. It is preferable for the transmittances of the first and second light-transmitting parts 21 and 22 for the peak wavelength of the light source part 10 to be, for example, not less than 60%, and more favorably not less than 80%.

Figure 2:
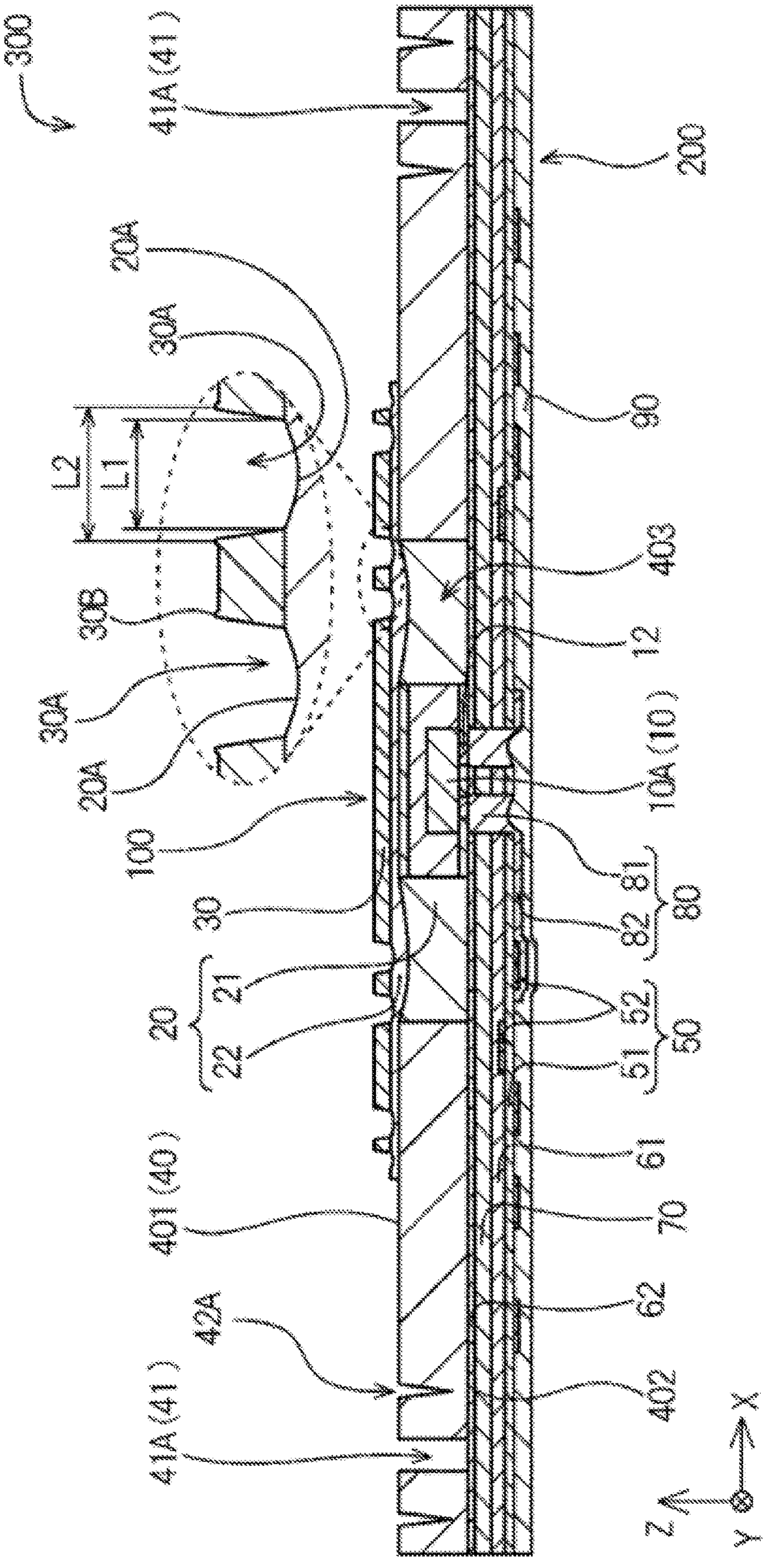
FIG. 2 is a schematic cross-sectional view along line II-II of FIG. 1.

As shown in FIG. 2, the first light-transmitting part 21 contacts the lateral surface of the light source part 10. Thereby, the light from the light source part 10 is more easily incident on the first light-transmitting part 21. It is preferable for the first light-transmitting part 21 to contact a light guide member 40 described below. Thereby, the light from the light source part 10 is more easily incident on the light guide member 40. It is preferable for the first light-transmitting part 21 to be located so that at least a portion of the upper surface of the light source part 10 is exposed. Thereby, the light-emitting module 100 is more easily downsized in the third direction (the Z-direction) as compared to the case in which the first light-transmitting part 21 covers the entire upper surface of the light source part 10. The first light-transmitting part 21 may be located so that the entire upper surface of the light source part 10 is exposed. Also, the first light-transmitting part 21 may cover the entire upper surface of the light source part 10. By the first light-transmitting part 21 covering the entire upper surface of the light source part 10, it is easier to adjust the luminance in the region directly above the light source part 10. For example, the luminance in the region directly above the light source part 10 can be adjusted by modifying the thickness of the portion of the first light-transmitting part 21 covering the upper surface of the light source part 10. Because the luminance is more easily adjusted thereby, the uneven luminance of the light-emitting module 100 is easily reduced. When the first light-transmitting part 21 covers the upper surface of the light source part 10, the second light-transmitting part 22 covers the upper surface of the light source part 10 with the first light-transmitting part 21 interposed.

The first light-transmitting part 21 may be configured as a single layer in the third direction (the Z-direction) or may be configured as a stacked body of multiple layers. The first light-transmitting part 21 may contain a phosphor and/or light-scattering particles. When the first light-transmitting part 21 is a stacked body, each layer may or may not contain a phosphor and/or light-scattering particles. For example, the first light-transmitting part 21 may include a layer that contains a phosphor and a layer that does not contain a phosphor. For example, a material similar to the resin member of the cover member 14 can be used as the material of the first light-transmitting part 21.

The second light-transmitting part 22 is positioned at the upper side of the light source part 10. The second light-transmitting part 22 is positioned at the upper side of the first light-transmitting part 21. It is preferable for the second light-transmitting part 22 to contact the upper surface of the light source part 10 and/or the upper surface of the first light-transmitting part 21. Thereby, the light-emitting module 100 is more easily downsized in the third direction (the Z-direction).

For example, a material similar to the resin member of the cover member 14 can be used as the material of the second light-transmitting part 22. A sheet-like optically clear adhesive (OCA) may be used as the second light-transmitting part 22. A hot-melt resin may be used as the material of the second light-transmitting part 22. The second light-transmitting part 22 may contain a phosphor and/or light-scattering particles.

As shown in FIG. 2, the light-transmitting member 20 has the recess 20A (hereinbelow, referred to as the light-transmitting recess). The luminance of the light-emitting module 100 is more easily adjusted thereby. By the light-transmitting member 20 having the light-transmitting recess 20A, the surface area of the light-transmitting member 20 can be increased. The amount of the light extracted from the light-transmitting member 20 through the light-transmitting member 20 can be increased thereby.

The light-transmitting recess 20A of the light-transmitting member 20 communicates with the through-hole 30A (hereinbelow, referred to as the light-adjusting through-hole) of the light-adjusting member 30. That is, the space inside the light-transmitting recess 20A and the space inside the light-adjusting through-hole 30A communicate with each other. The shielding of the light emitted from the light-transmitting recess 20A by the light-adjusting member 30 can be reduced thereby. That is, the light exiting the light-transmitting recess 20A passes through the light-adjusting through-hole 30A and is extracted outside the light-emitting module 100. The light extraction efficiency of the light-emitting module 100 is increased thereby. The light-transmitting recess 20A overlaps the light-adjusting through-hole 30A in a plan view.

As shown in FIG. 2, it is preferable for a maximum length L1 of the light-transmitting recess 20A in the lateral direction (i.e., in the direction extending along the XY plan) to be less than a maximum length L2 of the light-adjusting through-hole 30A in the lateral direction in a cross-sectional view. In other words, it is preferable for the maximum length L2 of the light-adjusting through-hole 30A in the lateral direction to be greater than the maximum length L1 of the light-transmitting recess 20A in the lateral direction. The shielding of the light emitted from the light-transmitting recess 20A by the light-adjusting member 30 can be reduced thereby.

At least a portion of the light-transmitting recess 20A of the light-transmitting member 20 is positioned lower than the lower surface of the light-adjusting member 30. The distance from the light-transmitting recess 20A to the light source part 10 in the third direction (the Z-direction) can be reduced thereby. The amount of the light from the light source part 10 that passes through the light-transmitting recess 20A and is extracted outside the light-emitting module 100 is more easily increased thereby.

Figure 4A:
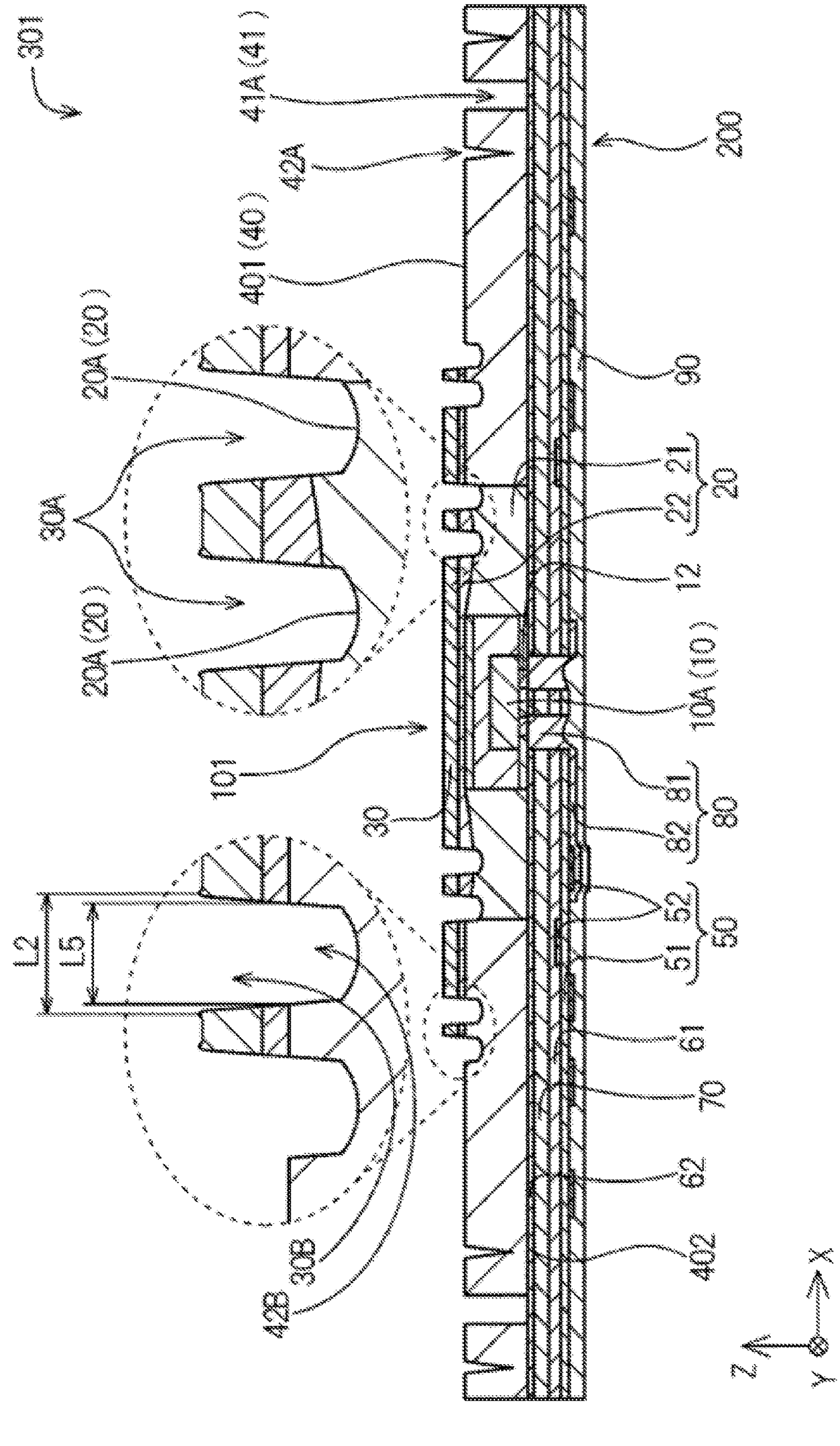
FIG. 4A is a schematic cross-sectional view of a modification of the planar light source according to the embodiment.

The light-transmitting recess 20A may be provided in only the second light-transmitting part 22 as shown in the light-emitting module 100 of FIG. 2, or the light-transmitting recess 20A may be provided to straddle the first light-transmitting part 21 and the second light-transmitting part 22 as shown in a light-emitting module 101 and a planar light source 301 of FIG. 4A. As shown in FIG. 2, a portion of the light-transmitting recess 20A may not overlap the light source part 10 in the lateral direction. In other words, the light-transmitting recess 20A may be positioned higher than the light source part 10. Thereby, the light that travels in the lateral direction from the light source part 10 is not easily extracted outside the light-emitting module 100 by passing through the light-transmitting recess 20A. Thereby, the light from the light source part 10 is easily spread in the lateral direction. As shown in FIG. 4A, a portion of the light-transmitting recess 20A may overlap the light source part 10 in the lateral direction. Thereby, the light that travels in the lateral direction from the light source part 10 is more easily extracted outside the light-emitting module 100 by passing through the light-transmitting recess 20A.

As shown in a light-emitting module 103 and a planar light source 303 of FIG. 4C, the light-transmitting member 20 may include a protrusion 20B (hereinbelow, referred to as the light-transmitting protrusion) extending upward. At least a portion of the light-transmitting protrusion 20B is positioned higher than the lower surface of the light-adjusting member 30. As shown in FIG. 4D, the light-transmitting protrusion 20B is positioned outward of the light-adjusting member 30. By the light-transmitting member 20 having the light-transmitting protrusion 20B, the surface area of the light-transmitting member 20 can be increased. The amount of the light extracted out of the light-transmitting member 20 can be increased thereby. The luminance of the light-emitting module 103 is more easily adjusted by modifying the size and/or position of the light-transmitting protrusion 20B. The uneven luminance of the light-emitting module 103 is easily reduced thereby.

The shapes and quantity of the light-transmitting protrusions 20B in a plan view are not particularly limited. For example, as shown in FIG. 4D, it is preferable for the light-transmitting protrusion 20B to have a ring shape surrounding the light source part 10 without breaks in a plan view. The surface area of the light-transmitting member 20 is more easily increased thereby, and the amount of the light extracted out of the light-transmitting member 20 is therefore more easily increased. As shown in FIG. 4D, it is preferable for multiple ring-shaped light-transmitting protrusions 20B to surround the light source part 10. The amount of the light extracted out of the light-transmitting member 20 is even more easily increased thereby. According to the embodiment, the outer edge of the light-transmitting protrusion 20B is quadrilateral in a plan view. The outer edge of the light-transmitting protrusion 20B in a plan view may be circular, elliptical, polygonal such as triangular, hexagonal, octagonal, etc. The outer edge of the light-transmitting protrusion 20B may include a curved portion in a plan view. Multiple light-transmitting protrusions 20B that are separated from each other may be positioned around the light source part 10 in a plan view.

According to the embodiment, the light-transmitting protrusion 20B is triangular in a cross-sectional view. In a cross sectional view, the light-transmitting protrusion 20B may be polygonal such as octagonal, hexagonal, quadrilateral such as trapezoidal, etc. The light-transmitting protrusion 20B may include a curved portion in a cross sectional view. The upper surface of the light-transmitting protrusion 20B may include a recess.

Light-Adjusting Member 30

The light-adjusting member 30 is reflective and transmissive to the light emitted by the light source part 10. A portion of the light emitted from the light source part 10 is reflected by the light-adjusting member 30; and another portion of the light passes through the light-adjusting member 30. The transmittance of the light-adjusting member 30 for the peak wavelength of the light source part 10 is less than the transmittances of the first and second light-transmitting parts 21 and 22 for the peak wavelength of the light source part 10. For example, it is preferable for the transmittance of the light-adjusting member 15 for the peak wavelength of the light source part 10 to be, for example, not less than 1% and not more than 50%, and more favorably not less than 3% and not more than 30%. The light-adjusting member 30 may be configured as a single layer or may be configured as a stacked body of multiple layers.

The light-adjusting member 30 is located at the upper side of the light source part 10. The light-adjusting member 30 and the light source part 10 overlap in a plan view; and the light-adjusting member 30 is positioned at the upper side of the light source part 10 at the overlapping portion. Because the light-adjusting member 30 is positioned at the upper side of the light source part 10, the region directly above the light source part 10 can be prevented from being too bright.

The light-adjusting member 30 is located at the upper side of the first light-transmitting part 21. The light-adjusting member 30 and the first light-transmitting part 21 overlap in a plan view; and the light-adjusting member 30 is positioned at the upper side of the first light-transmitting part 21 at the overlapping portion. Because the light-adjusting member 30 is positioned at the upper side of the first light-transmitting part 21, the region directly above the first light-transmitting part 21 can be prevented from being too bright.

The light-adjusting member 30 is located at the upper side of the second light-transmitting part 22. The light-adjusting member 30 and the second light-transmitting part 22 overlap in a plan view; and the light-adjusting member 30 is positioned at the upper side of the second light-transmitting part 22 at the overlapping portion. Because the light-adjusting member 30 is positioned at the upper side of the second light-transmitting part 22, the region directly above the second light-transmitting part 22 can be prevented from being too bright.

The light-adjusting member 30 has the light-adjusting through-hole 30A. Because the light-adjusting member 30 has the light-adjusting through-hole 30A, it is easier to adjust the luminance in the region directly above the light-adjusting member 30. For example, the shielding of the light from the light source part 10 by the light-adjusting member 30 can be adjusted by modifying the size and/or position of the light-adjusting through-hole 30A. The luminance in the region directly above the light-adjusting member 30 is more easily adjusted thereby, and the uneven luminance of the light-emitting module 100 is easily reduced. The light-adjusting through-hole 30A is positioned away from the outer edge of the light-adjusting member 30 in a plan view.

It is preferable for the light-adjusting through-hole 30A of the light-adjusting member 30 to be positioned away from the light source part 10 in a plan view. Thereby, the region directly above the light source part 10 can be prevented from being too bright. When the light-adjusting member 30 has multiple light-adjusting through-holes 30A, it is preferable for all of the multiple light-adjusting through-holes 30A to be positioned away from the light source part 10 in a plan view. Thereby, the region directly above the light source part 10 can be prevented from being too bright. When the light-adjusting member 30 has multiple light-adjusting through-holes 30A, at least one of the multiple light-adjusting through-holes 30A of the light-adjusting member 30 may overlap the light source part 10 in a plan view.

Figure 5A:
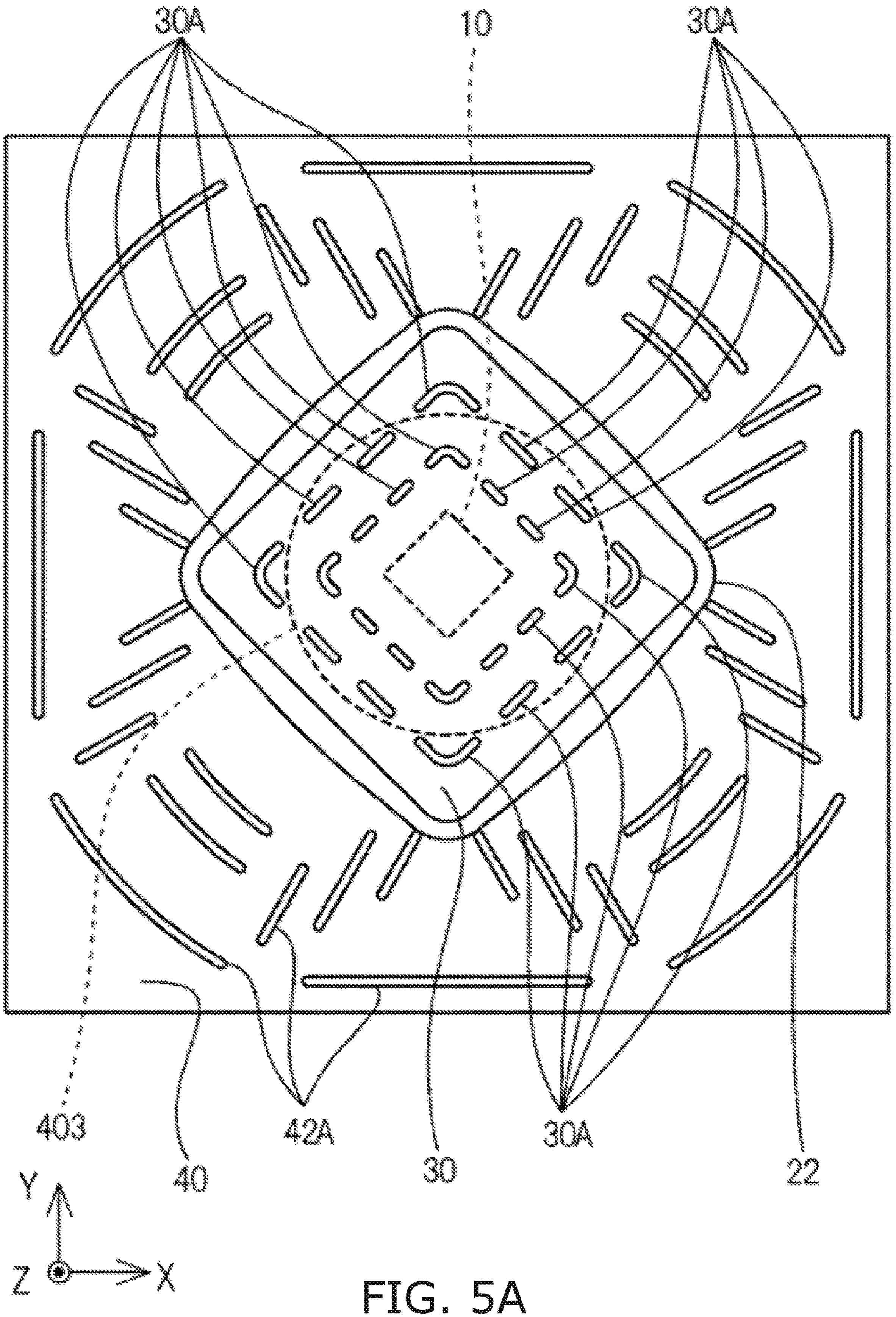
FIG. 5A is a schematic plan view of a modification of the planar light source according to the embodiment.
Figure 5B:
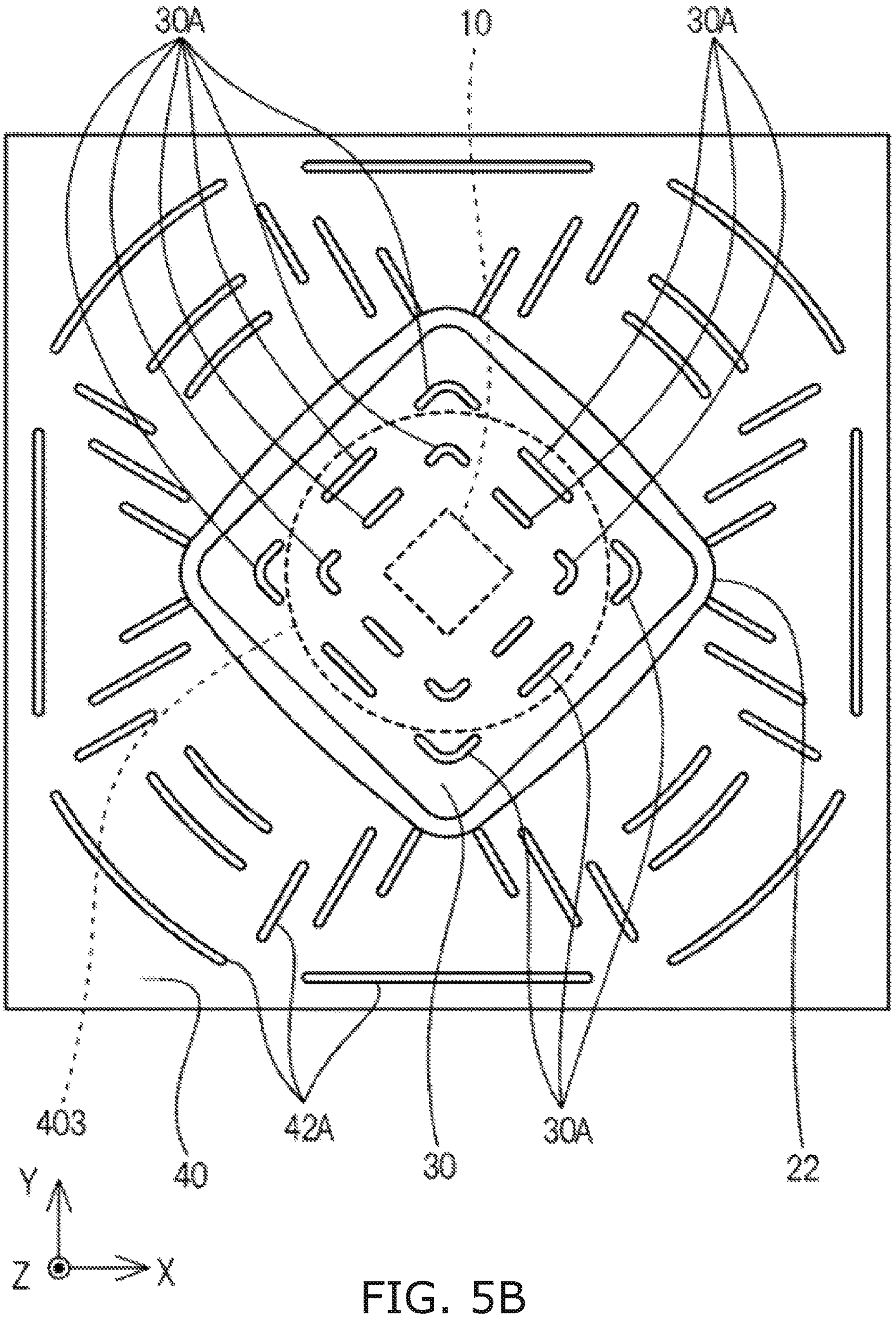
FIG. 5B is a schematic plan view of a modification of the planar light source according to the embodiment.
Figure 5C:
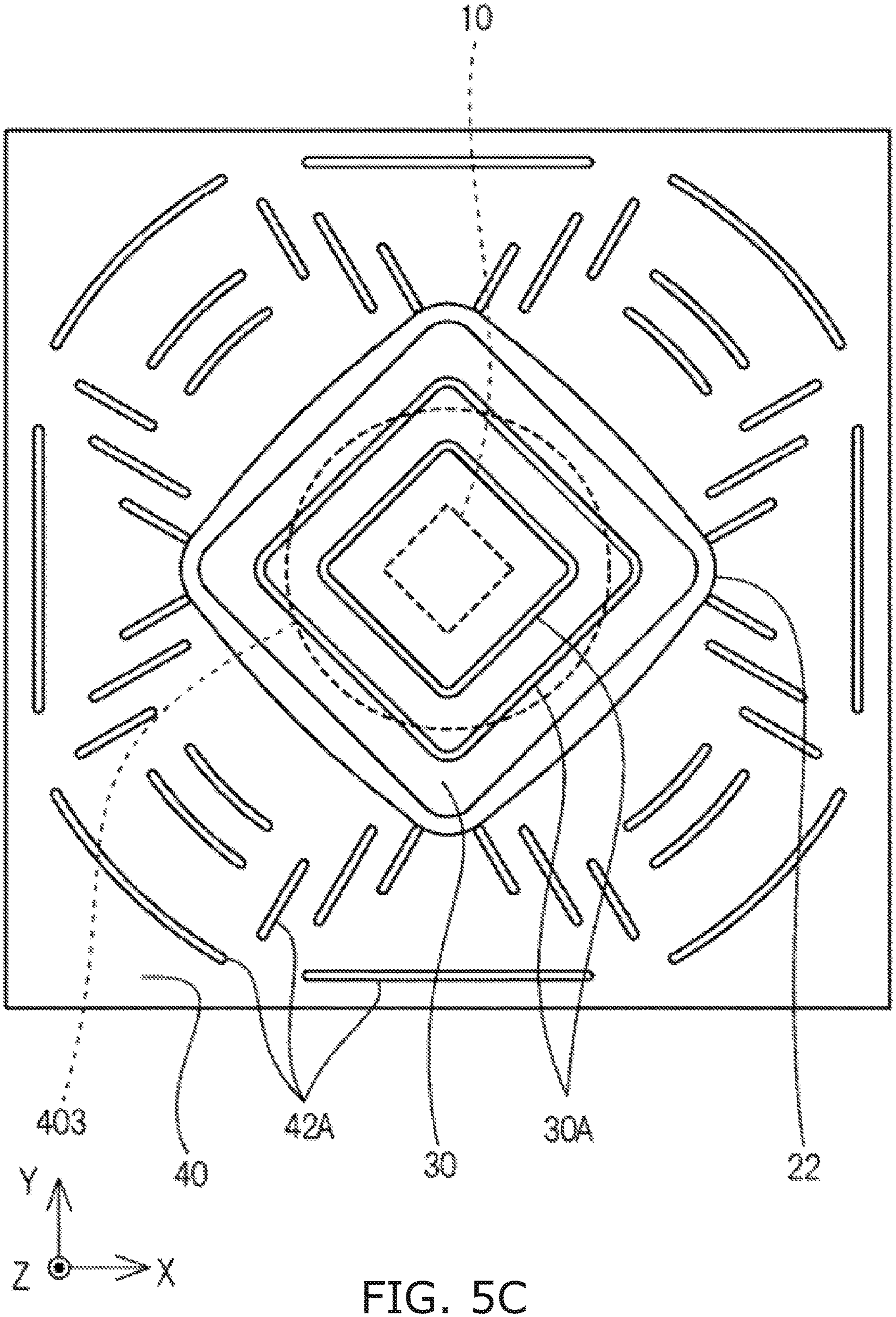
FIG. 5C is a schematic plan view of a modification of the planar light source according to the embodiment.

The shape of the light-adjusting through-hole 30A in a plan view is not particularly limited. As shown in FIG. 1, the shape of the light-adjusting through-hole 30A is circular in a plan view. As shown in FIG. 5A, FIG. 5B, and FIG. 5C, the shape of the light-adjusting through-hole 30A in a plan view may include a line-shaped portion. The light-adjusting through-hole 30A including a line-shaped portion means that the light-adjusting through-hole 30A includes a portion at which the length of the light-adjusting through-hole 30A in the direction in which the light-adjusting through-hole 30A is elongated is greater than the width of the light-adjusting through-hole 30A in a direction orthogonal to the direction in which the light-adjusting through-hole 30A is elongated in a plan view. In the specification, "line-shaped" also encompasses a straight line, a curve, a bent line, etc. For example, the shape of the light-adjusting through-hole 30A in a plan view may include a V-shaped or L-shaped portion extending in two directions. The shape of the light-adjusting through-hole 30A in a plan view may be elliptical or polygonal such as triangular, quadrilateral, hexagonal, octagonal, etc.

As shown in FIG. 5A, FIG. 5B, and FIG. 5C, it is preferable for at least a portion of the outer edge of the opening of the light-adjusting member 30 defining the light-adjusting through-hole 30A to be parallel to the outer edge of the light source part 10 in a plan view. Thereby, the light that is emitted from the light source part 10 easily passes through the light-adjusting through-hole 30A, and the luminance of the light-emitting module 100 is more easily adjusted by the light-adjusting through-hole 30A.

As shown in FIG. 1, FIG. 5A, FIG. 5B, and FIG. 5C, it is preferable for the light-adjusting through-holes 30A to surround the light source part 10 in a plan view. Thereby, the luminance of the light-emitting module 100 in the first direction (the X-direction) and/or the second direction (the Y-direction) is more easily adjusted by the light-adjusting through-hole 30A. As shown in FIG. 1, FIG. 5A, and FIG. 5B, it is preferable for the light source part 10 to be surrounded with interspersed multiple light-adjusting through-holes 30A in a plan view. Thereby, it is more easily to intersperse portions of low luminance and portions of high luminance at the vicinities of the light-adjusting through-holes 30A. Thereby, the noticeability of the boundary between the luminance of the portion positioned inside the outer edge of the light-adjusting through-hole 30A and the luminance of the portion positioned outside the outer edge of the light-adjusting through-hole 30A can be suppressed. As shown in FIG. 5C, the light-adjusting through-hole 30A may surround the light source part 10 without breaks in a plan view.

As shown in FIG. 2, it is preferable for the light-adjusting member 30 to include a protrusion 30B extending upward (hereinbelow, referred to as the first light-adjusting protrusion). A portion of the surface of the first light-adjusting protrusion 30B is defined by a portion of the surface of the light-adjusting member 30 defining the light-adjusting through-hole 30A. The first light-adjusting protrusion 30B is located at the upper surface side of the light-adjusting member 30. When an optical sheet such as a prism sheet, a light-diffusing sheet, or the like is located above the light-emitting module 100, an air layer is easily located between the light-adjusting member 30 and the optical sheet even when the first light-adjusting protrusion 30B and the optical sheet contact each other. The light from the light source part 10 is reflected or refracted by the air layer between the light-adjusting member 30 and the optical sheet; accordingly, the light is easily spread to regions distant to the light source part 10. The uneven luminance of the light-emitting module can be reduced thereby. According to the embodiment, the first light-adjusting protrusion 30B surrounds the light-adjusting through-hole 30A in a plan view. The light-adjusting member 30 may have a protrusion (hereinbelow, referred to as the second light-adjusting protrusion) extending downward. A portion of the surface of the second light-adjusting protrusion is defined by a portion of the surface of the light-adjusting member 30 defining the light-adjusting through-hole 30A. The second light-adjusting protrusion is located at the lower surface side of the light-adjusting member 30. By the light-adjusting member 30 having the second light-adjusting protrusion, the contact area between the second light-transmitting part 22 and the light-adjusting member 30 is more easily increased. The adhesion of the second light-transmitting part 22 and the light-adjusting member 30 can be improved thereby.

As shown in FIG. 1, it is preferable for the light-adjusting member 30 to have multiple recesses 30C (hereinbelow, referred to as light-adjusting recesses) that are concave in the lateral direction (i.e., in the direction extending along the XY plan) in a plan view. The light-adjusting recesses 30C are located at the outer edge of the light-adjusting member 30. By the light-adjusting member 30 having the light-adjusting recesses 30C, it is easier to adjust the luminance at the periphery of the light-adjusting member 30. For example, the shielding of the light from the light source part 10 by the light-adjusting member 30 can be adjusted by modifying the size and/or position of the light-adjusting recess 30C. The luminance at the periphery of the light-adjusting member 30 is more easily adjusted thereby; accordingly, the uneven luminance of the light-emitting module 100 is easily reduced. By the light-adjusting member 30 having the multiple light-adjusting recess 30C, portions of high luminance and portions of low luminance are more easily interspersed at the outer edge vicinity of the light-adjusting member 30. Thereby, the noticeability of the boundary between the luminance of the portion positioned inside the outer edge of the light-adjusting member 30 and the luminance of the portion positioned outside the outer edge of the light-adjusting member 30 can be suppressed at the outer edge vicinity of the light-adjusting member 30. The size of the light-adjusting recess 30C is not particularly limited. The maximum length of the light-adjusting recess 30C in the first direction may be less than the maximum length of the light-adjusting through-hole 30A in the first direction. The maximum length of the light-adjusting recess 30C in the second direction may be less than the maximum length of the light-adjusting through-hole 30A in the second direction.

The light-adjusting member 30 can include a resin member 31A (hereinbelow, referred to as the light-adjusting resin member), and a reflector 31B (hereinbelow, referred to as the light-adjusting reflector) contained in the light-adjusting resin member 31A. A material similar to the resin member of the cover member 14 can be used as the material of the light-adjusting resin member 31A. A material similar to the light-scattering particles of the cover member 14 can be used as the material of the light-adjusting reflector 31B. A gas such as air or the like may be used as the light-adjusting reflector 31B.

It is preferable for the refractive index of the light-adjusting reflector 31B to be less than the refractive index of the light-adjusting resin member 31A. Thereby, a portion of the light from the light source part 10 that is incident on the light-adjusting resin member 31A is totally reflected more easily at the interface between the light-adjusting resin member 31A and the light-adjusting reflector 31B. The light that escapes upward from the light source part 10 can be reduced thereby, and the region directly above the light source part 10 can therefore be prevented from being too bright. In the specification, the refractive index means the refractive index of the peak wavelength of the light source part 10.

When the refractive index of the light-adjusting reflector 31B is less than the refractive index of the light-adjusting resin member 31A, it is preferable for the refractive index of the light-adjusting resin member 31A to be greater than the refractive index of the base material of the first light-transmitting part 21. The refractive index difference between the light-adjusting resin member 31A and the light-adjusting reflector 31B is more easily increased thereby. Thereby, a portion of the light traveling from the light-adjusting resin member 31A to the light-adjusting reflector 31B is totally reflected more easily at the interface between the light-adjusting resin member 31A and the light-adjusting reflector 31B. The light that escapes upward from the light source part 10 can be reduced thereby, and the region directly above the light source part 10 can therefore be prevented from being too bright.

Figure 6A:
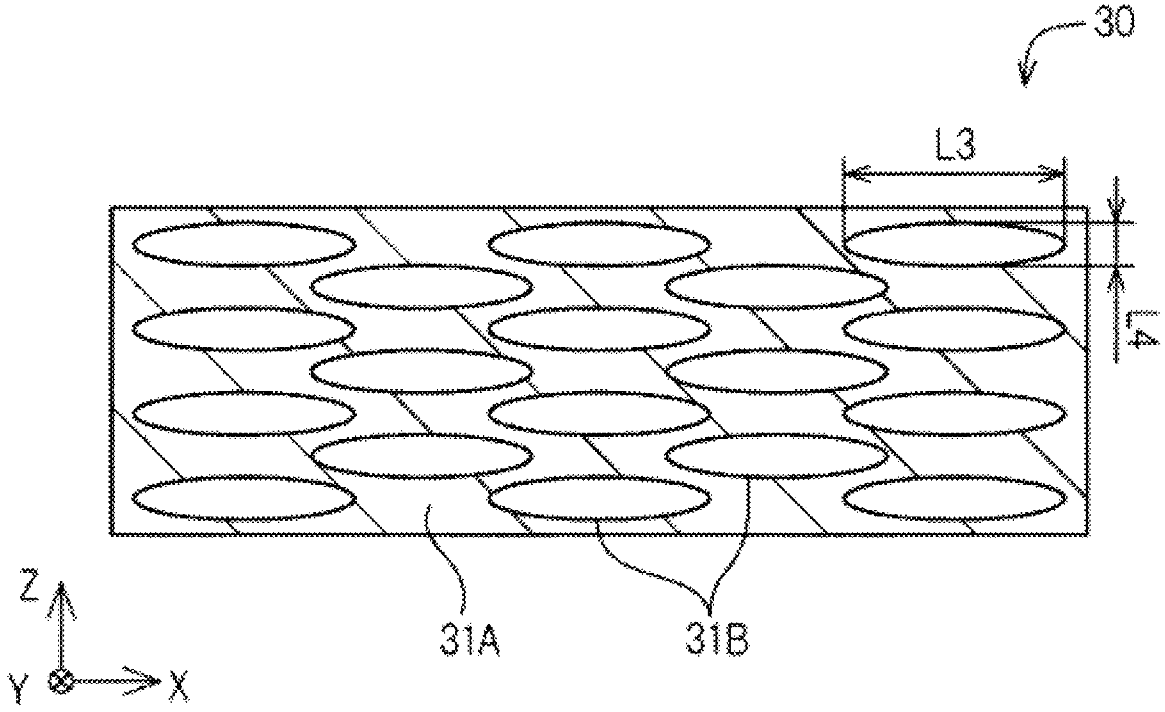
FIG. 6A is a schematic cross-sectional view of a light-adjusting member according to the embodiment.

As shown in FIG. 6A, in a cross sectional view, it is preferable for a maximum length L3 in the lateral direction (i.e., in the direction extending along the XY plan) of the light-adjusting reflector 31B to be greater than a maximum length L4 in the vertical direction of the light-adjusting reflector 31B. Thereby, the surface of the light-adjusting reflector 31B facing the light source part 10 can be a flat surface more easily as compared to the case in which the light-adjusting reflector 31B is spherical. Thereby, the light that is emitted from the light source part 10 is more easily reflected in a direction away from the light source part 10 when the light is reflected by a portion of the light-adjusting member 30 positioned at the periphery of the light source part 10 in a plan view. That is, the light that is emitted from the light source part 10 and is returned to the light source part 10 by being reflected by a portion of the light-adjusting member 30 can be reduced. The absorption of the light emitted from the light source part 10 by the light source part 10 can be reduced thereby, and the light extraction efficiency of the light-emitting module 100 is therefore increased. For example, when the light source light-transmitting member 13 of the light source part 10 contains a phosphor, the light that is emitted from the light source part 10 and is returned to the light source part 10 by being reflected by the light-adjusting member 30 can be reduced; accordingly, over-conversion of the wavelength of the light from the light source part 10 by the phosphor included in the light source light-transmitting member 13 can be reduced. The maximum length L3 of the light-adjusting reflector 31B in the lateral direction is not particularly limited. For example, the maximum length L3 of the light-adjusting reflector 31B in the lateral direction is not less than 2 times the maximum length L4 of the light-adjusting reflector 31B in the vertical direction (the Z-direction).

Light Guide Member 40

As shown in FIGS. 1 and 2, the light-emitting module 100 includes the light guide member 40. The light guide member 40 is a member that is transmissive to the light emitted by the light source part 10. It is preferable for the transmittance of the light guide member 40 for the peak wavelength of the light source part 10 to be, for example, not less than 60%, and more favorably not less than 80%. As shown in FIG. 2, the light guide member 40 has a first surface 401 used as the light-emitting surface of the light-emitting module 100, and a second surface 402 positioned at the side opposite to the first surface 401. The light guide member 40 includes a housing part 403 extending from the first surface 401 to the second surface 402. The light source part 10 is located in the housing part 403 of the light guide member 40. According to the embodiment, the housing part 403 is circular in a plan view. The housing part 403 may be elliptical or polygonal such as triangular, quadrilateral, hexagonal, octagonal, etc., in a plan view. The light-emitting module 100 may not include the light guide member 40.

The quantity of the light guide members 40 included in the light-emitting module 100 may be one or more. According to the embodiment, the light-emitting module 100 includes multiple light guide members 40 including a first light guide part 40A, a second light guide part 40B, a third light guide part 40C, and a fourth light guide part 40D. The first light guide part 40A and the second light guide part 40B are next to each other in the first direction (the X-direction). The third light guide part 40C and the fourth light guide part 40D are next to each other in the first direction (the X-direction). The first light guide part 40A and the third light guide part 40C are next to each other in the second direction (the Y-direction). The second light guide part 40B and the fourth light guide part 40D are next to each other in the second direction (the Y-direction). The first light source 10A is located in the housing part 403 of the first light guide part 40A. The second light source 10B is located in the housing part 403 of the second light guide part 40B. The third light source 10C is located in the housing part 403 of the third light guide part 40C. The fourth light source 10D is located in the housing part 403 of the fourth light guide part 40D.

As shown in FIG. 1, it is preferable for at least a portion of the outer edge of the light-adjusting member 30 to be positioned outward from the outer edge of the housing part 403 in a plan view. Thereby, the vicinity of the outer edge of the housing part 403 can be prevented from being too bright. The entire outer edge of the light-adjusting member 30 may be positioned further outward from the outer edge of the housing part 403 in a plan view. The entire outer edge of the light-adjusting member 30 may be positioned inward from the outer edge of the housing part 403 in a plan view. The surface area of the light-transmitting member 20 exposed from under the light-adjusting member 30 in a plan view is more easily increased thereby. The amount of the light extracted out of the light-transmitting member 20 through the light-transmitting member 20 can be increased thereby.

The light guide member 40 is partitioned by a partitioning groove 41. One region partitioned by the partitioning groove 41 is taken as a light-emitting region 300A. According to the embodiment, the first light guide part 40A, the second light guide part 40B, the third light guide part 40C, and the fourth light guide part 40D that are partitioned by the partitioning groove 41 are individual light-emitting regions 300A. One light-emitting region 300A can be the driving unit of local dimming. The quantity of the light-emitting regions 300A included in the planar light source 300 is not particularly limited. For example, the planar light source 300 may has one light-emitting region 300A, or the planar light source 300 may has multiple light-emitting regions 300A. A planar light source device that has a larger surface area may be made by arranging the multiple planar light sources 300. A member that is reflective to the light emitted by the light source part 10 may be located inside the partitioning groove 41. The contrast ratio between a light-emitting region in a light-emitting state and a light-emitting region in a non-light-emitting state can be improved thereby. In the light-emitting module, a member that is reflective to the light emitted by the light source part 10 may not be provided inside the partitioning groove 41.

According to the embodiment, the light guide member 40 includes a lattice-shaped partitioning groove 41 including first partitioning groove portions 41A extending in the second direction (the Y-direction), and second partitioning groove portions 41B extending in the first direction (the X-direction). The first partitioning groove portion 41A that extends in the second direction (the Y-direction) is positioned between the first light guide part 40A and the second light guide part 40B. The second partitioning groove portion 41B that extends in the first direction (the X-direction) is positioned between the first light guide part 40A and the third light guide part 40C. It is preferable for the partitioning groove 41 to extend from the first surface 401 to the second surface 402 of the light guide member 40. Thereby, the light guide member 40 can be divided into a plurality of parts; therefore, for example, warpage of the support member 200 due to the thermal expansion coefficient difference between the light guide member 40 and the support member 200 can be reduced. The occurrence of cracks in a conductive member 80 described below can be reduced thereby. The partitioning groove 41 may be a recess open at only the first surface 401 side of the light guide member 40, or may be a recess open at only the second surface 402 side of the light guide member 40. When the partitioning groove 41 is a recess, the partitioning groove 41 has a bottom surface formed of the light guide member 40.

As shown in FIG. 2, it is preferable for the light guide member 40 to have a hole part 42A (hereinbelow, referred to as the first light guide hole part) open at the first surface 401 side of the light guide member 40. The first light guide hole part 42A is positioned between the housing part 403 and the partitioning groove 41 in a plan view. The first light guide hole part 42A does not overlap the light-adjusting member 30 in a plan view. According to the embodiment, the first light guide hole part 42A is a recess open at only the first surface 401 side. The first light guide hole part 42A may extend from the first surface 401 to the second surface 402 of the light guide member 40, or may be a recess open at only the second surface 402 side of the light guide member 40. By the light guide member 40 including the first light guide hole part 42A, the surface area of the light guide member 40 can be increased. The amount of the light extracted outside the light guide member 40 from the surface of the light guide member 40 can be increased thereby. The luminance of the light-emitting module 100 is more easily adjusted thereby, and the uneven luminance of the light-emitting module 100 is easily reduced. The depth of the recess in the third direction (the Z-direction) is, for example, not less than 0.1 times the thickness of the light guide member 40.

The shape of the first light guide hole part 42A in a plan view is not particularly limited. As shown in FIG. 1, the first light guide hole part 42A of the embodiment has a shape extending in one direction. The shape of the first light guide hole part 42A in a plan view may be a V-shape or an L-shape extending in two directions. The shape of the first light guide hole part 42A in a plan view may include a curved portion. The shape of the first light guide hole part 42A in a plan view may be circular, elliptical, or polygonal such as triangular, quadrilateral, hexagonal, octagonal, etc.

In the specification, the point most distant to the center of the first light source 10A on the outer edge of the first light guide part 40A positioned at the first surface 401 is referred to as a first point P1; and the point most proximate to the center of the first light source 10A on the outer edge of the first light guide part 40A positioned at the first surface 401 is referred to as a second point P2. According to the embodiment, the first point P1 is positioned at a corner of the first light guide part 40A; and the second point P2 is positioned at the center of each side of the first light guide part 40A. The quantities of the first points P1 and the second points P2 are one or plural.

As shown in FIG. 1, it is preferable for at least one of the first light guide hole parts 42A to be positioned on an imaginary straight line connecting the first point P1 and the center of the first light source 10A in a plan view. The uneven luminance of the light-emitting module is reduced thereby. Although the luminance easily becomes lower at the first point P1 distant to the first light source 10A than at the second point P2 proximate to the first light source 10A, by positioning the first light guide hole part 42A on the imaginary straight line, the amount of the light extracted outside the light guide member 40 at the vicinity of the first point P1 is more easily increased. The difference between the luminance at the first point P1 and the luminance at the second point P2 can be reduced thereby, and the uneven luminance of the light-emitting module is therefore reduced.

It is preferable for multiple first light guide hole parts 42A to be positioned on the imaginary straight line connecting the first point P1 and the center of the first light source 10A. The luminance at the vicinity of the first point P1 is more easily adjusted thereby, and the uneven luminance of the light-emitting module is easily reduced. It is preferable for the quantity of the first light guide hole parts 42A positioned on the imaginary straight line connecting the first point P1 and the center of the first light source 10A to be greater than the quantity of the first light guide hole parts 42A positioned on the imaginary straight line connecting the second point P2 and the center of the first light source 10A. The difference between the luminance at the first point P1 and the luminance at the second point P2 is more easily reduced thereby. There is no first light guide hole part 42A positioned on the imaginary straight line connecting the second point P2 and the center of the first light source 10A.

It is preferable for at least one of the first light guide hole parts 42A to extend in a direction oblique to the first and second directions to extend away from the first light source 10A from the end portion of the first light guide hole part 42A proximate to the center of the first light source 10A in a plan view. Thereby, a portion of the light from the first light source 10A can be guided in the direction in which the first light guide hole part 42A extends. The uneven luminance of the light-emitting module can be reduced thereby.

The shapes and/or quantity of the first light guide hole parts 42A located in the first light guide part 40A and the shapes and/or quantity of the first light guide hole parts 42A located in the second light guide part 40B may be respectively the same or different. For example, the uneven luminance of the first light guide part 40A and the uneven luminance of the second light guide part 40B are checked before forming the first light guide hole parts 42A in the light guide member 40. The first light guide hole parts 42A that are suited to the first and second light guide parts 40A and 40B are formed in the light guide member 40 after checking the uneven luminance of the first light guide part 40A and the uneven luminance of the second light guide part 40B. The uneven luminance of the light-emitting module 100 can be reduced thereby. For example, if the uneven luminance is within the desired range before forming the first light guide hole parts 42A in the light guide member 40, the first light guide hole parts 42A may not be provided in the light guide member 40. For example, as the technique of checking the uneven luminance of the first light guide part 40A and the uneven luminance of the second light guide part 40B, the luminance can be checked by measuring with a two-dimensional color luminance meter (Konica Minolta CA-2500).

As in the light-emitting module 101 shown in FIG. 4A, the light guide member 40 may have a hole part 42B (hereinbelow, referred to as the second light guide hole part) that is open at the first surface 401 side of the light guide member 40 and communicates with the light-adjusting through-hole 30A of the light-adjusting member 30. The space inside the second light guide hole part 42B and the space inside the light-adjusting through-hole 30A may communicate with each other. The shielding of the light emitted from the second light guide hole part 42B by the light-adjusting member 30 can be reduced thereby. The second light guide hole part 42B may extend from the first surface 401 to the second surface 402 of the light guide member 40. By the light guide member 40 including the second light guide hole part 42B, the surface area of the light guide member 40 can be increased. The amount of the light extracted outside the light guide member 40 from the surface of the light guide member 40 can be increased thereby.

It is preferable for a maximum length L5 of the second light guide hole part 42B in the lateral direction to be less than the maximum length L2 of the light-adjusting through-hole 30A in the lateral direction in a cross sectional view. In other words, it is preferable for the maximum length L2 of the light-adjusting through-hole 30A in the lateral direction to be greater than the maximum length L5 of the second light guide hole part 42B in the lateral direction. The shielding of the light emitted from the second light guide hole part 42B by the light-adjusting member 30 can be reduced thereby.

As in a light-emitting module 102 and a planar light source 302 shown in FIG. 4B, the light guide member 40 may have a hole part 42C (hereinbelow, referred to as the third light guide hole part) that is open at the first surface 401 side of the light guide member 40 and is positioned at the lower side of the light-adjusting through-hole 30A of the light-adjusting member 30. The third light guide hole part 42C overlaps the light-adjusting through-hole 30A in a plan view. The surface of the light guide member 40 defining the third light guide hole part 42C contacts the second light-transmitting part 22. The luminance in the region directly above the light-adjusting through-hole 30A is more easily adjusted thereby. For example, the luminance in the region directly above the light-adjusting through-hole 30A can be adjusted by modifying the thickness of the second light-transmitting part 22 contacting the third light guide hole part 42C. The luminance is more easily adjusted thereby, and the uneven luminance of the light-emitting module 100 is easily reduced.

For example, a thermoplastic resin such as acrylic, polycarbonate, cyclic polyolefin, polyethylene terephthalate, polyester, or the like, a thermosetting resin such as epoxy, silicone, or the like, glass, etc., can be used as the material of the light guide member 40.

It is preferable for the thickness of the light guide member 40 to be, for example, not less than 150 μm and not more than 800 μm. In the specification, the thickness of each member is taken to be the maximum value from the upper surface of the member to the lower surface of the member along the third direction (the Z-direction). The light guide member 40 may be configured as a single layer in the third direction or may be configured as a stacked body of multiple layers. When the light guide member 40 is configured as a stacked body, one or more transmissive adhesives may be located between the layers. The major materials of the layers of the stacked body may be different types.

Support Member 200

The support member 200 is a member on which the light-emitting module 100 is located. The support member 200 supports the light source part 10 and the light guide member 40. The light guide member 40 is located on the support member 200 so that the second surface 402 faces the upper surface of the support member 200.

The support member 200 includes a wiring substrate 50. The wiring substrate 50 includes an insulating base material 51, and at least one wiring layer 52 located in at least one surface of the insulating base material 51. The insulating base material 51 may be a rigid substrate or a flexible substrate. It is preferable for the insulating base material 51 to be a flexible substrate to make the planar light source thin. The insulating base material 51 may be configured as a single layer in the third direction (the Z-direction) or may be configured as a stacked body of multiple layers. For example, the insulating base material 51 may be configured as a single-layer flexible substrate or may be configured as a stacked body of multiple rigid substrates. For example, a resin such as polyimide or the like can be used as the material of the insulating base material 51. The wiring layer 52 is a metal film, e.g., a copper film.

The support member 200 further includes a first adhesive layer 61 located on the wiring substrate 50, a reflecting member 70 located on the first adhesive layer 61, and a second adhesive layer 62 located on the reflecting member 70.

The first adhesive layer 61 is located between the wiring substrate 50 and the reflecting member 70 and bonds the wiring substrate 50 and the reflecting member 70. The first adhesive layer 61 can be formed of, for example, a resin member that contains light-scattering particles. For example, a material similar to the resin member of the cover member 14 can be used as the resin member of the first adhesive layer 61. For example, a material similar to the light-scattering particles of the cover member 14 can be used as the light-scattering particles of the first adhesive layer 61. A sheet-like optical clear adhesive may be used as the first adhesive layer 61.

It is preferable for the refractive index of the resin member of the first adhesive layer 61 to be less than the refractive index of the resin member of the reflecting member 70. Thereby, a portion of the light traveling from the reflecting member 70 to the first adhesive layer 61 is totally reflected more easily at the interface between the reflecting member 70 and the first adhesive layer 61. The light that escapes downward from the light-emitting module 100 can be reduced thereby, and the light extraction efficiency of the light-emitting module 100 is therefore increased.

The reflecting member 70 is located below the second surface 402 of the light guide member 40, below the light source part 10, below the light-transmitting member 20, and below the partitioning groove 41. The reflecting member 70 is reflective to the light emitted by the light source part 10. The reflecting member 70 can be formed of a resin member, and a reflector contained in the resin member. For example, a material similar to the resin member of the cover member 14 can be used as the resin member of the reflecting member 70. A material similar to the light-scattering particles of the cover member 14 can be used as the material of the reflector of the reflecting member 70. A gas such as air or the like may be used as the reflector of the reflecting member 70.

It is preferable for the refractive index of the reflector of the reflecting member 70 to be less than the refractive index of the resin member of the reflecting member 70. Thereby, a portion of the light from the light source part 10 that is incident on the reflecting member 70 is totally reflected more easily at the interface between the resin member of the reflecting member 70 and the reflector of the reflecting member 70. The light that escapes downward from the reflecting member 70 can be reduced thereby, and the light extraction efficiency of the light-emitting module 100 is therefore increased.

When the refractive index of the reflector of the reflecting member 70 is less than the refractive index of the resin member of the reflecting member 70, it is preferable for the refractive index of the resin member of the reflecting member 70 to be greater than the refractive index of the base material of the first light-transmitting part 21. The refractive index difference between the resin member of the reflecting member 70 and the reflector of the reflecting member 70 is more easily increased thereby. Thereby, a portion of the light from the light source part 10 that is incident on the reflecting member 70 is totally reflected more easily at the interface between the resin member of the reflecting member 70 and the reflector of the reflecting member 70.

The second adhesive layer 62 is located between the reflecting member 70 and the second surface 402 of the light guide member 40 to bond the reflecting member 70 and the light guide member 40. The light source part 10 is located on the second adhesive layer 62 inside the housing part 403 of the light guide member 40. The second adhesive layer 62 can be formed of, for example, a resin member that contains light-scattering particles. For example, a material similar to the resin member of the cover member 14 can be used as the resin member of the second adhesive layer 62. For example, a material similar to the light-scattering particles of the cover member 14 can be used as the light-scattering particles of the second adhesive layer 62. A sheet-like optical clear adhesive may be used as the second adhesive layer 62.

It is preferable for the refractive index of the resin member of the second adhesive layer 62 to be less than the refractive index of the base material of the light guide member 40. Thereby, a portion of the light traveling from the light guide member 40 to the second adhesive layer 62 is totally reflected more easily at the interface between the light guide member 40 and the second adhesive layer 62. The light that escapes downward from the light-emitting module 100 can be reduced thereby, and the light extraction efficiency of the light-emitting module 100 is therefore increased. It is preferable for the refractive index of the resin member of the second adhesive layer 62 to be less than the refractive index of the base material of the first light-transmitting part 21. Thereby, a portion of the light traveling from the first light-transmitting part 21 to the second adhesive layer 62 is totally reflected more easily at the interface between the first light-transmitting part 21 and the second adhesive layer 62. The light that escapes downward from the light-emitting module 100 can be reduced thereby, and the light extraction efficiency of the light-emitting module 100 is therefore increased.

The support member 200 further includes the conductive member 80. The conductive member 80 is formed of, for example, a resin, and metal particles contained in the resin. For example, an epoxy resin or a phenol resin can be used as the resin of the conductive member 80. For example, particles of copper or silver can be used as the metal particles.

The conductive member 80 includes a connection part 81 and a wiring part 82. The connection part 81 extends through the second adhesive layer 62, the reflecting member 70, the first adhesive layer 61, and the insulating base material 51 in the third direction (the Z-direction). The wiring part 82 is located at the surface of the wiring substrate 50 at which the wiring layer 52 is located; and the wiring part 82 is connected with the connection part 81. The connection part 81 and the wiring part 82 can be formed as a continuous body of the same material. A portion of the wiring part 82 is connected with the wiring layer 52.

A pair of conductive members 80 are separated from each other and are provided to correspond to the pair of positive and negative electrodes 12 of the light source part 10. The connection part 81 of one conductive member 80 is connected with the positive-side electrode 12 below the light source part 10; and the connection part 81 of the other conductive member 80 is connected with the negative-side electrode 12 below the light source part 10. The electrodes 12 of the light source part 10 are electrically connected with the conductive members 80 and the wiring layer 52.

Figure 6B:
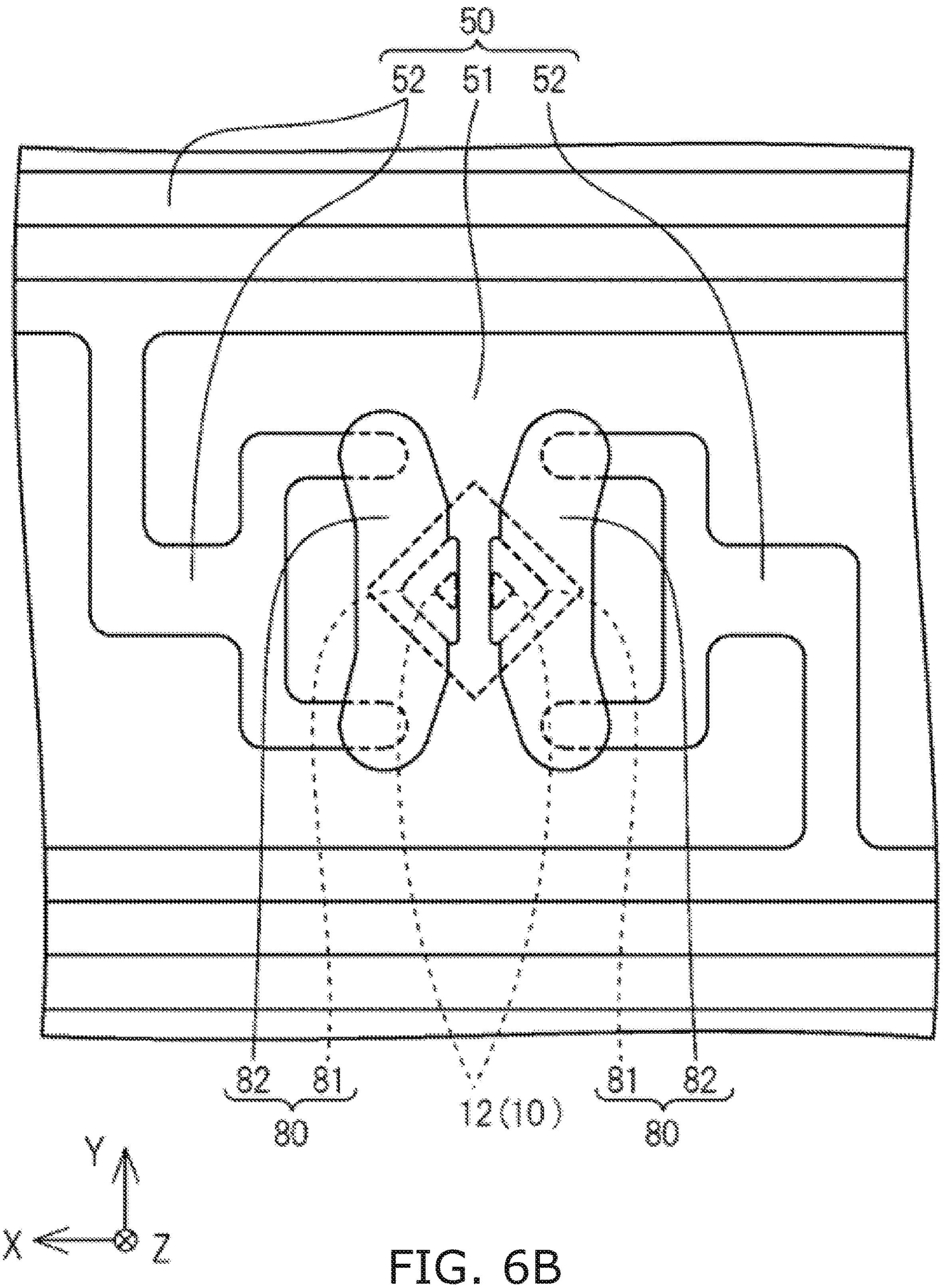
FIG. 6B is a schematic bottom view showing an example of the lower region of the light source part of the planar light source according to the embodiment.

The shape of the connection part 81 of the conductive member 80 in a bottom view is not particularly limited. According to the embodiment as shown in FIG. 6B, the shape of the connection part 81 is triangular in a bottom view. The shape of the connection part 81 in a bottom view may be circular, elliptical, or polygonal such as quadrilateral, hexagonal, octagonal, etc. The corners of the connection part 81 may include curved portions in a bottom view. It is preferable for the portion having the shortest length from the outer edge of the electrode 12 of the light source part 10 to the outer edge of the corresponding conductive member 80 in a bottom view to be positioned between the pair of electrodes 12. This can reduce a possibility of short-circuits due to contact between the pair of conductive members 80 provided to correspond to the pair of electrodes 12. It is preferable for the outer edge of the conductive member 80 electrically connected with one of the pair of electrodes 12 to be parallel to the outer edge of the conductive member 80 electrically connected with the other of the pair of electrodes 12 between the pair of electrodes 12. This can reduce a possibility of short-circuits due to contact between the pair of conductive members 80. The conductive member 80 and the wiring layer 52 may be connected at one location, or may be connected at multiple locations as shown in FIG. 6B. It is preferable for the conductive member 80 and the wiring layer 52 to be connected at multiple locations. This can tend to reduce a breakage of portions of the electrical circuit.

The support member 200 further includes an insulating layer 90. The insulating layer 90 is located at the lower surface of the wiring substrate 50 and covers the wiring layer 52. For example, an epoxy resin, a urethane resin, or an acrylic resin can be used as the material of the insulating layer 90.

An example of a method for manufacturing the light-emitting module 102 and the planar light source 302 will now be described with reference to FIGS. 7A to 7L.

Figure 7A:
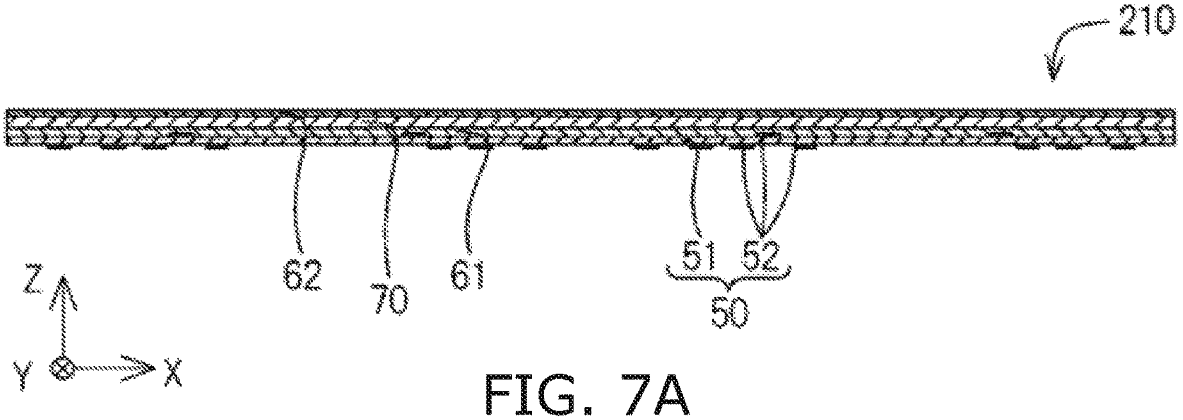
FIG. 7A is a schematic cross-sectional view showing a method for manufacturing the planar light source according to the embodiment.

A stacked member 210 shown in FIG. 7A is provided by manufacturing, or by assignment or the like including procurement. The stacked member 210 includes the wiring substrate 50, the first adhesive layer 61 located on the wiring substrate 50, the reflecting member 70 located on the first adhesive layer 61, and the second adhesive layer 62 located on the reflecting member 70. The process of providing the stacked member 210 may include, after the provision of the wiring substrate 50 by assignment or the like, a process of disposing the first adhesive layer 61 on the wiring substrate 50, a process of disposing the reflecting member 70 on the first adhesive layer 61, and a process of disposing the second adhesive layer 62 on the reflecting member 70. The provision may be performed by the assignment of members in an intermediate state of the processes. The fact that the provision may be performed by assignment or the like in each process is not mentioned as appropriate. The stacked member 210 may further include the insulating layer 90 covering the lower surface of the wiring substrate 50. The stacked member 210 is a portion of the support member 200 of the planar light source 302.

Figure 7B:
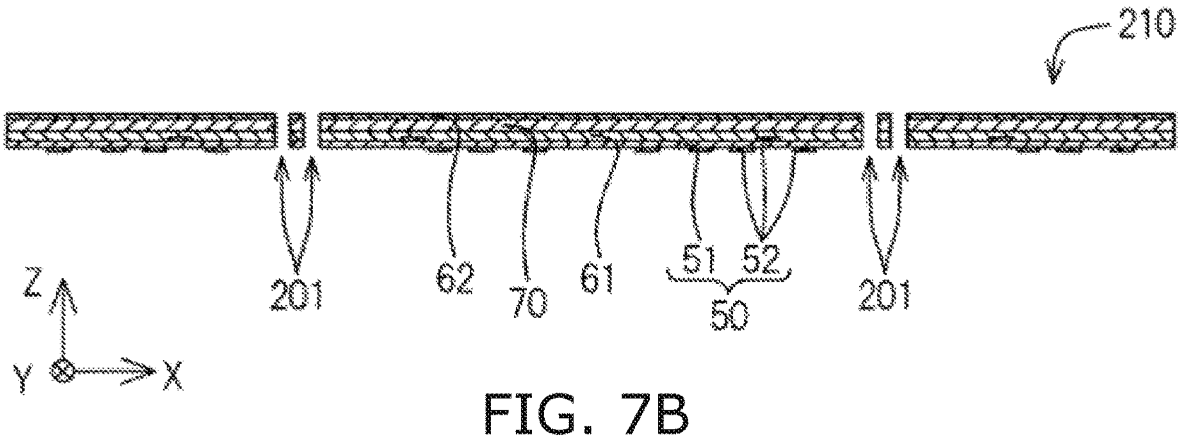
FIG. 7B is a schematic cross-sectional view showing the method for manufacturing the planar light source according to the embodiment.

As shown in FIG. 7B, a through-hole 201 that extends through the second adhesive layer 62, the reflecting member 70, the first adhesive layer 61, the wiring substrate 50, and the insulating layer 90 is formed in the stacked member 210. For example, the through-hole 201 is formed by punching, drilling, or laser irradiation. The through-hole 201 is circular in a plan view. Other than circular, the through-hole 201 may be elliptical or polygonal in a plan view.

Figure 7C:
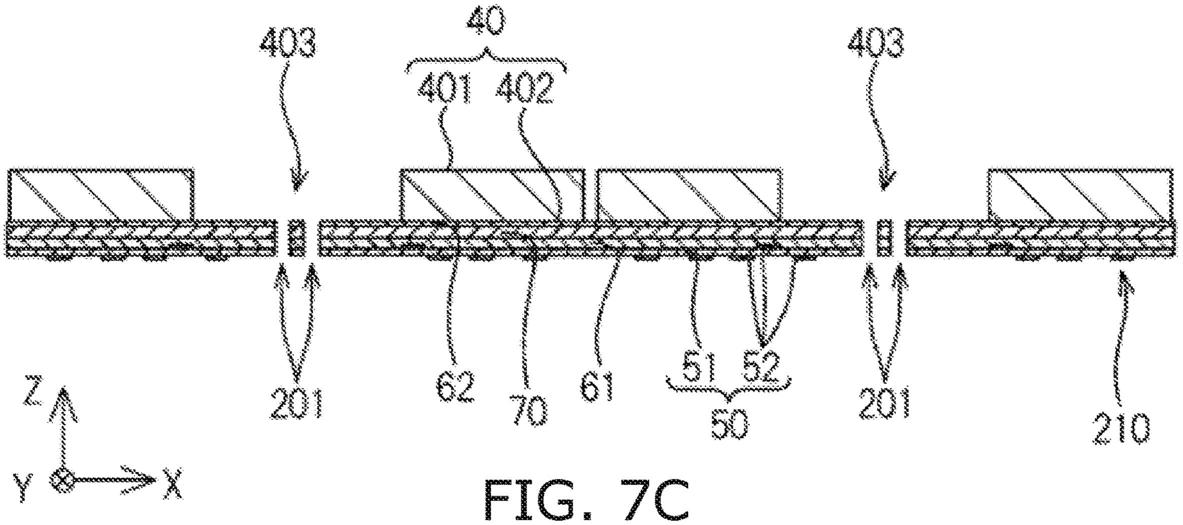
FIG. 7C is a schematic cross-sectional view showing the method for manufacturing the planar light source according to the embodiment.

As shown in FIG. 7C, the light guide member 40 is disposed on the stacked member 210 in which the through-hole 201 is formed. The second surface 402 of the light guide member 40 is bonded to the second adhesive layer 62 of the stacked member 210. The through-hole 201 that is formed in the stacked member 210 overlaps the housing part 403 formed in the light guide member 40. The housing part 403 and the two through-holes 201 overlap in a plan view.

Figure 7D:
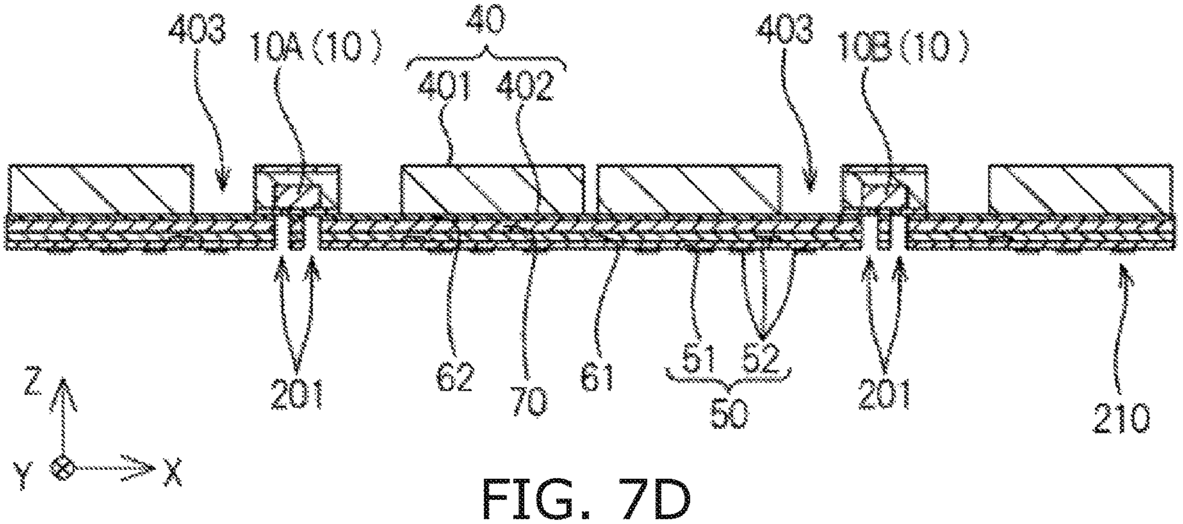
FIG. 7D is a schematic cross-sectional view showing the method for manufacturing the planar light source according to the embodiment.

As shown in FIG. 7D, the light source part 10 is disposed inside the housing part 403. For example, the lower surface of the light source part 10 and the upper surface of the second adhesive layer 62 are bonded. The light source part 10 is located inside the housing part 403 so that the electrodes of the light source part 10 and the through-holes 201 formed in the stacked member 210 overlap in a plan view. The light source part 10 is located inside the housing part 403 so that one through-hole 201 faces one electrode (e.g., the positive electrode) of the positive and negative pair of electrodes of the light source part, and one through-hole 201 faces the other electrode (e.g., the negative electrode) of the pair.

Figure 7E:
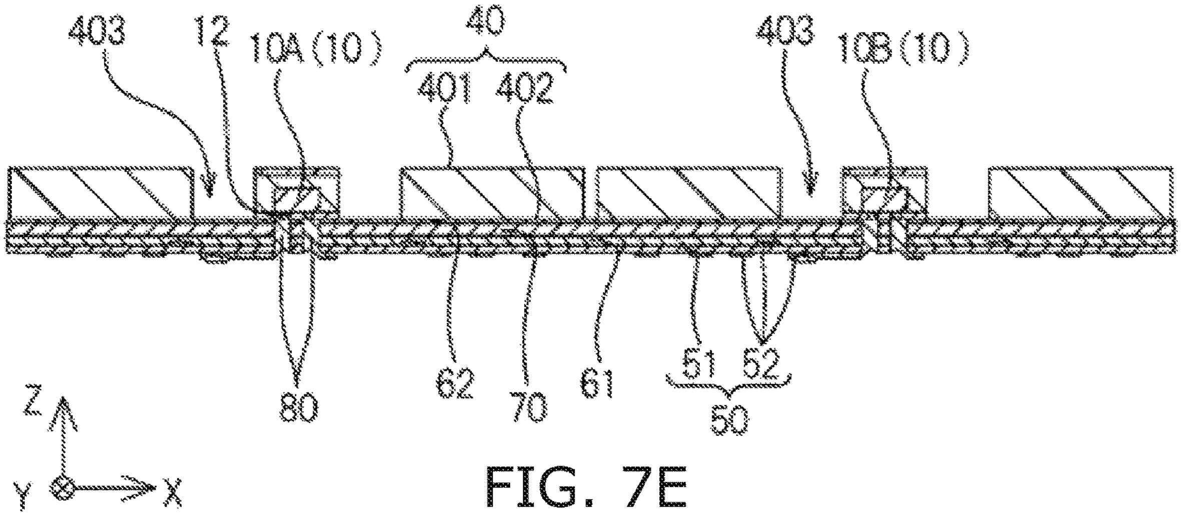
FIG. 7E is a schematic cross-sectional view showing the method for manufacturing the planar light source according to the embodiment.

After the light source part 10 is disposed inside the housing part 403, the conductive member 80 is formed inside the through-hole of the stacked member 210 as shown in FIG. 7E. For example, the conductive member 80 that is connected with the electrode 12 of the light source part 10 can be formed by disposing a conductive paste inside the through-hole and then curing. The conductive member 80 also is formed at the lower surface of the wiring substrate 50 and is connected with the wiring layer 52 of the wiring substrate 50.

After the conductive member 80 is formed, the insulating layer 90 that covers the lower surface of the conductive member 80 is formed. For example, the insulating layer 90 can be formed by a method such as printing, potting, spraying, inkjet, bonding a resin sheet, etc.

Figure 7F:
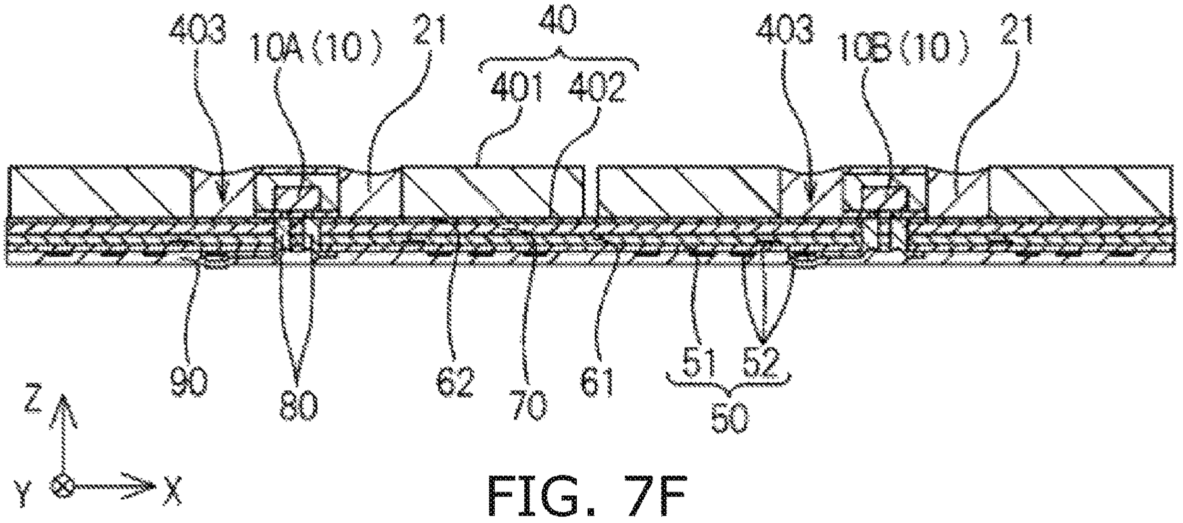
FIG. 7F is a schematic cross-sectional view showing the method for manufacturing the planar light source according to the embodiment.

After forming the insulating layer 90 covering the lower surface of the conductive member 80, the first light-transmitting part 21 that covers the lateral surface of the light source part 10 is formed inside the housing part 403 as shown in FIG. 7F. The first light-transmitting part 21 is formed to contact the lateral surface of the first light source 10A. For example, the first light-transmitting part 21 can be formed by supplying a liquid light-transmitting resin to the interior of the housing part 403 and then curing the light-transmitting resin by heating.

Figure 7G:
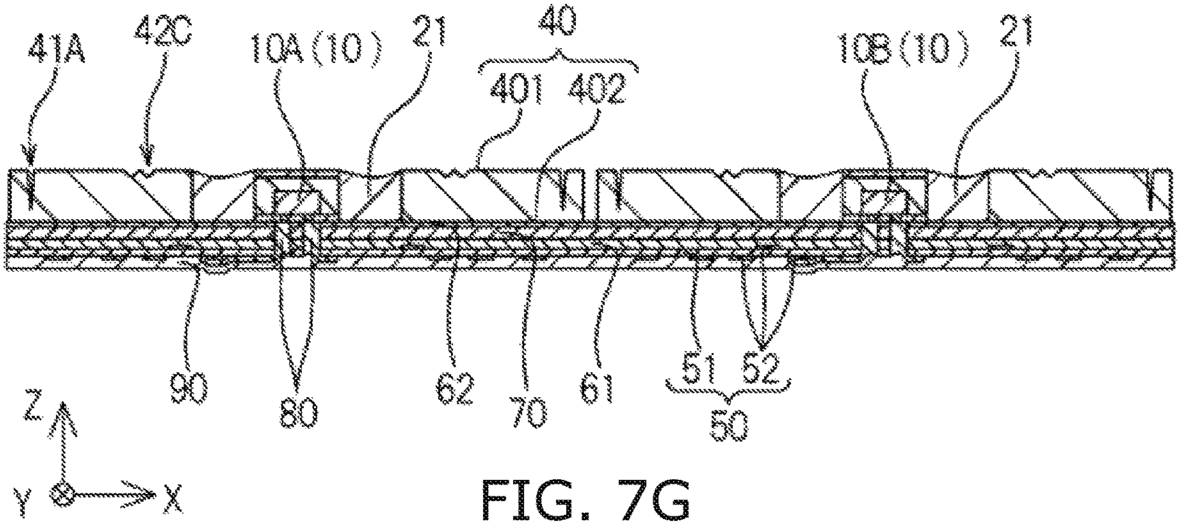
FIG. 7G is a schematic cross-sectional view showing the method for manufacturing the planar light source according to the embodiment.

After the first light-transmitting part 21 is formed, the first light guide hole part 42A and the third light guide hole part 42C that are open at the first surface 401 side of the light guide member 40 are formed as shown in FIG. 7G. For example, the first light guide hole part 42A and the third light guide hole part 42C can be formed by laser irradiation, cutting, etc.

Figure 7H:
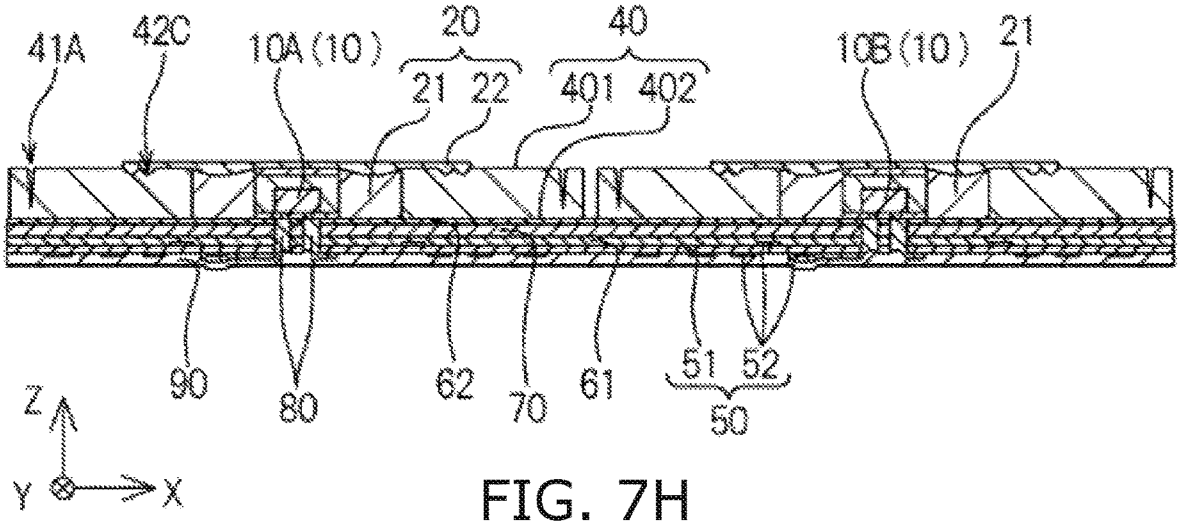
FIG. 7H is a schematic cross-sectional view showing the method for manufacturing the planar light source according to the embodiment.

After the first light guide hole part 42A and the third light guide hole part 42C are formed, the uncured second light-transmitting part 22 is disposed at the upper side of the light source part 10 and the first light-transmitting part 21 as shown in FIG. 7H. The uncured second light-transmitting part 22 is disposed to contact the surface of the light guide member 40 defining the third light guide hole part 42C. For example, the uncured second light-transmitting part 22 can be disposed at the upper side of the light source part 10 and the first light-transmitting part 21 by potting, spraying, inkjet, etc.

Figure 7I:
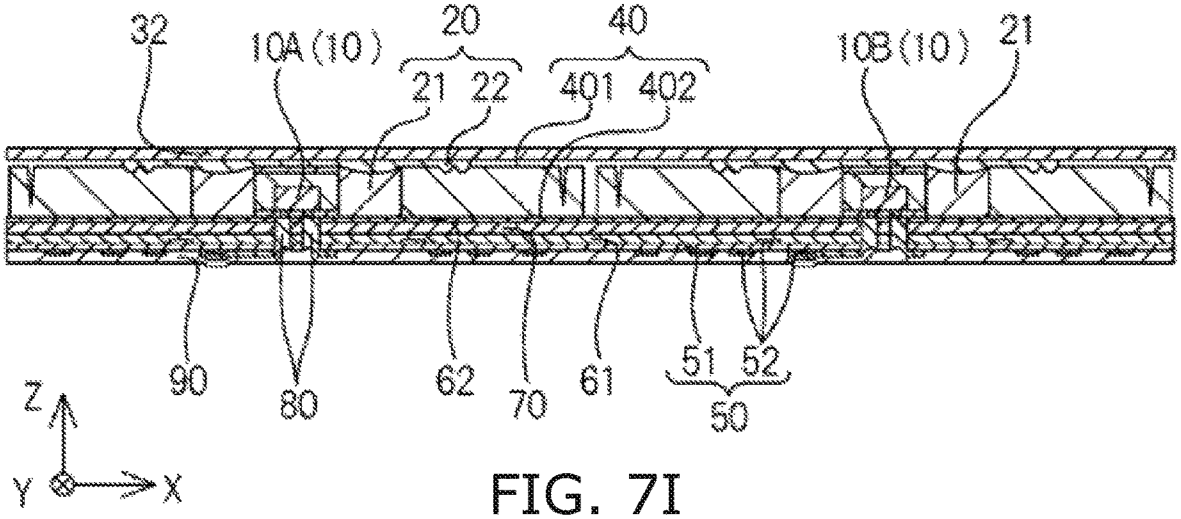
FIG. 7I is a schematic cross-sectional view showing the method for manufacturing the planar light source according to the embodiment.
Figure 7J:
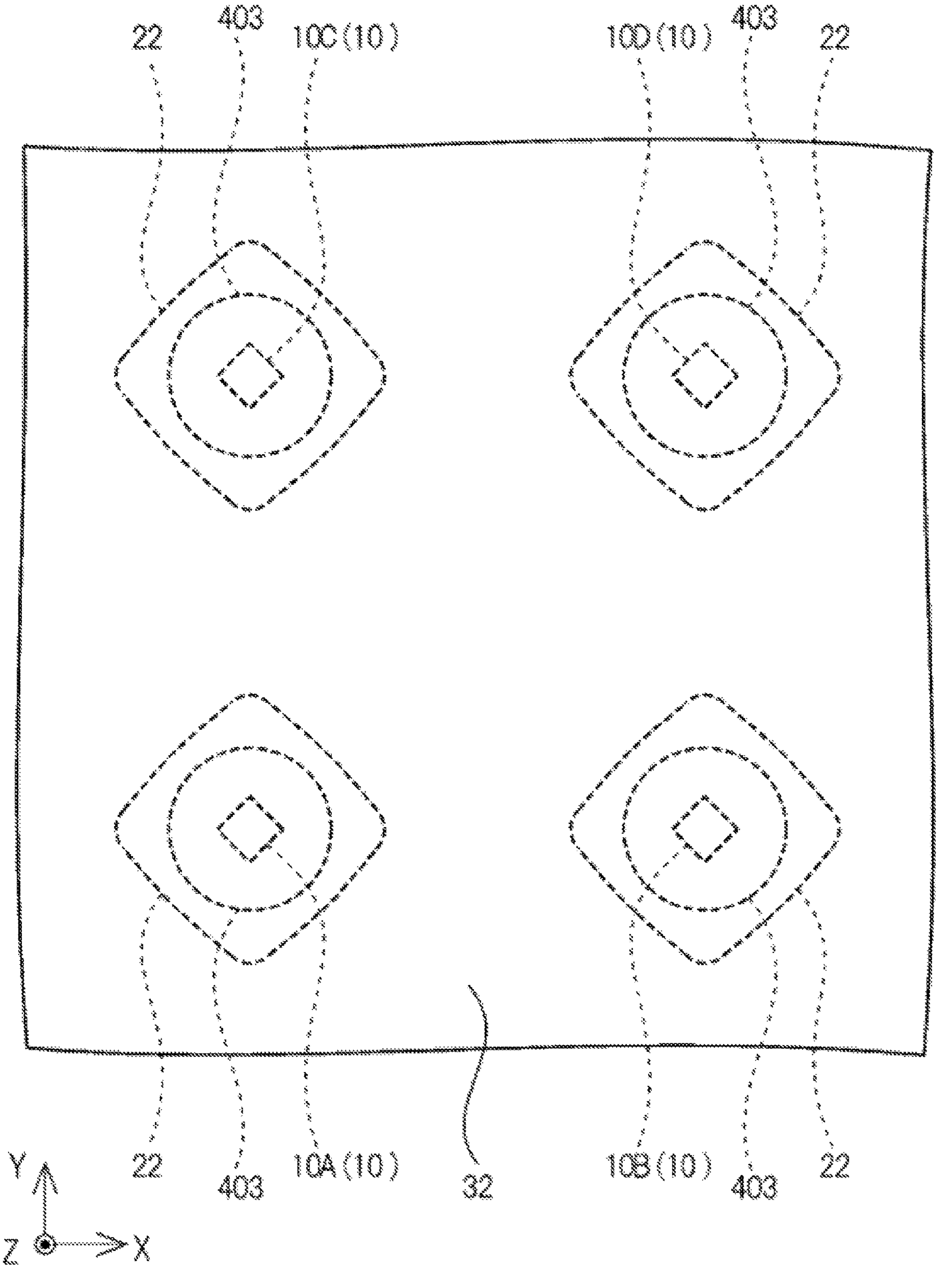
FIG. 7J is a schematic plan view showing the method for manufacturing the planar light source according to the embodiment.

After the uncured second light-transmitting part 22 is disposed at the upper side of the light source part 10 and the first light-transmitting part 21, a light-adjusting member 32 (hereinbelow, referred to as the light-adjusting intermediate member) is disposed at the upper side of the light source part 10 and the first light-transmitting part 21 with the uncured second light-transmitting part 22 interposed as shown in FIG. 7I. As shown in FIG. 7J, the light-adjusting intermediate member 32 overlaps the multiple light source parts 10 in a plan view. The second light-transmitting part 22 can be formed by curing the uncured second light-transmitting part 22 by heating. The light-adjusting intermediate member 32 is fixed to the light source part 10 and the first light-transmitting part 21 by the second light-transmitting part 22 after curing. Thereby, an intermediate body is provided that includes the light source part 10, the light-transmitting member 20 contacting the lateral surface of the light source part 10, and the light-adjusting intermediate member 32 positioned at the upper side of the light source part 10 and the light-transmitting member 20. The light-transmitting member 20 includes the first light-transmitting part 21 and the second light-transmitting part 22.

Figure 7K:
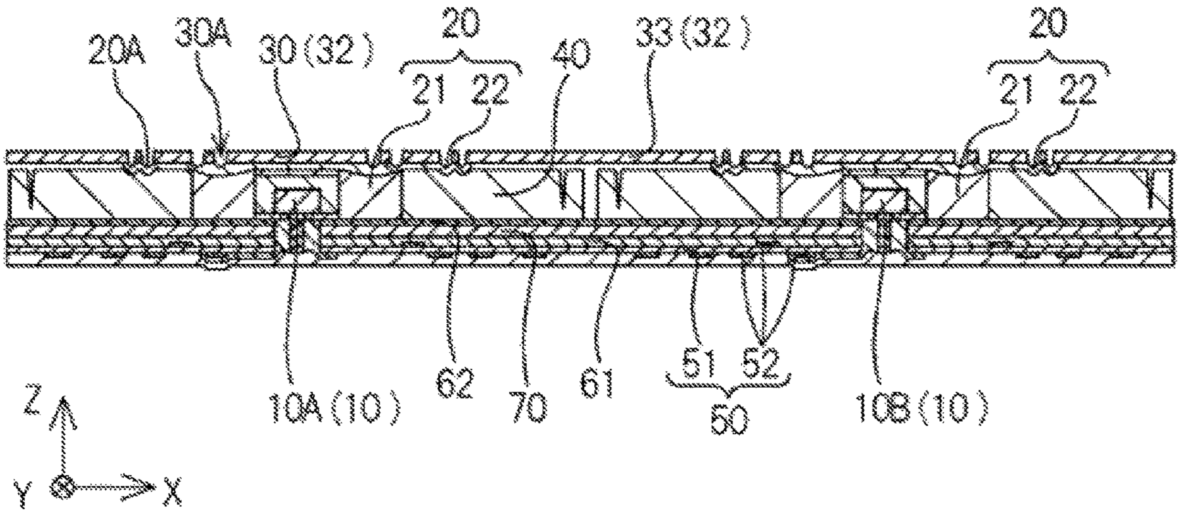
FIG. 7K is a schematic cross-sectional view showing the method for manufacturing the planar light source according to the embodiment.
Figure 7L:
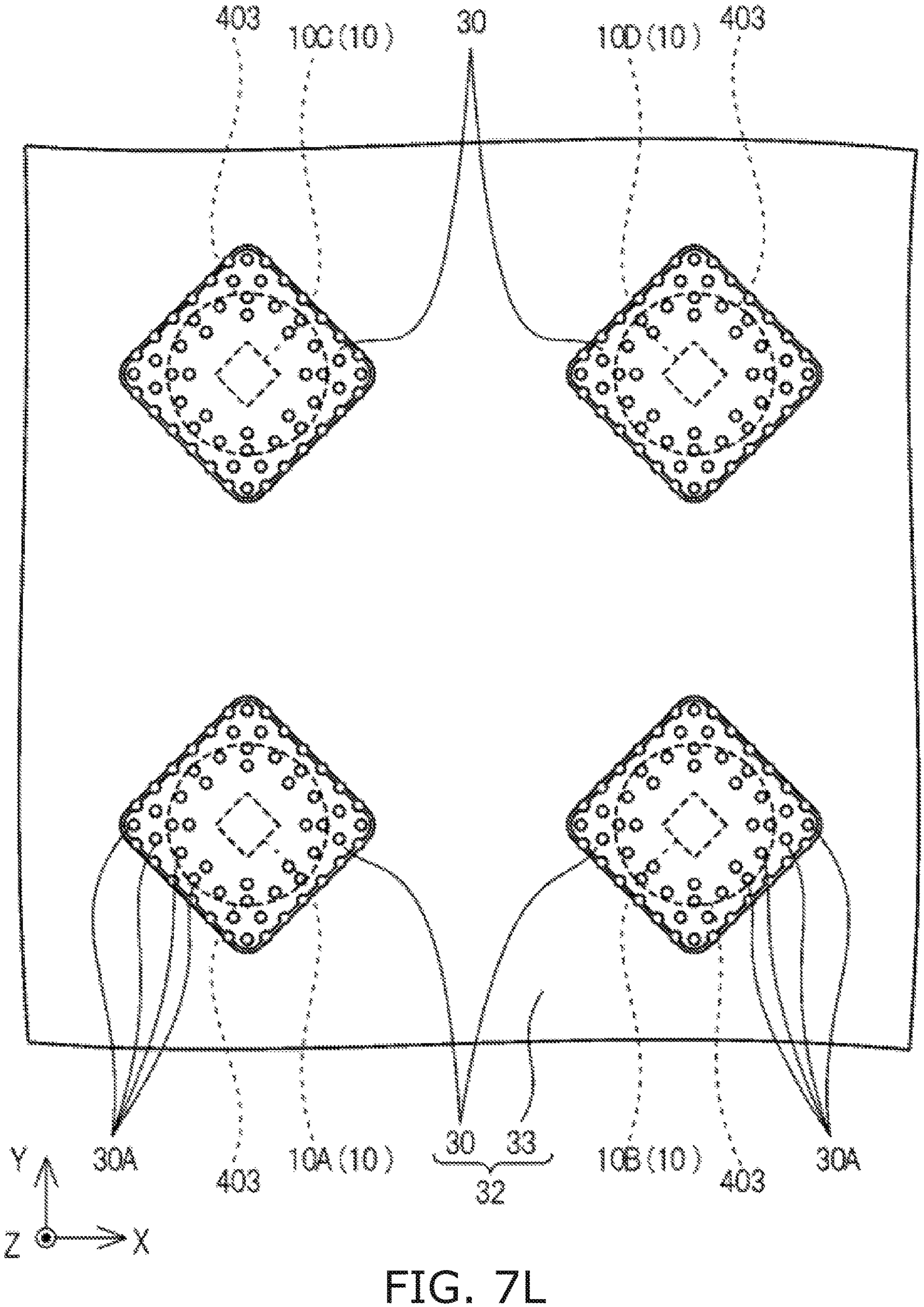
FIG. 7L is a schematic plan view showing the method for manufacturing the planar light source according to the embodiment.

After the process of providing the intermediate body, the light-adjusting through-hole 30A is formed in the light-adjusting intermediate member 32 as shown in FIGS. 7K and 7L. The light-adjusting through-hole 30A of the light-adjusting intermediate member 32 is positioned away from the light source part 10 in a plan view. The light-adjusting through-hole 30A can be formed by laser irradiation, etc. The light-transmitting recess 20A that communicates with the light-adjusting through-hole 30A is formed in the light-transmitting member 20 in the process of forming the light-adjusting through-hole 30A. By forming the light-adjusting through-hole 30A in the light-adjusting intermediate member 32 after the light-adjusting intermediate member 32 is disposed at the upper side of the light source part 10, the variation of the position of the light-adjusting through-hole 30A with respect to the light source part 10 is reduced more easily as compared to the case in which the light-adjusting intermediate member 32 in which the light-adjusting through-hole 30A is formed is disposed at the upper side of the light source part 10. The light-adjusting intermediate member 32 is singulated into the light-adjusting members 30 located at the upper sides of the light source parts 10. The light-adjusting intermediate member 32 can be singulated into the light-adjusting members 30 by laser irradiation, etc. As shown in FIGS. 7K and 7L, the light-adjusting intermediate member 32 is divided into the multiple light-adjusting members 30 located at the upper sides of the light source parts 10, and a light-adjusting end piece 33 positioned between the multiple light-adjusting members 30. The process of singulating into the light-adjusting members 30 may be performed after the process of forming the light-adjusting through-hole 30A, or the process of forming the light-adjusting through-hole 30A may be performed after the process of singulating into the light-adjusting members 30.

The light-adjusting end piece 33 is removed after the process of singulating into the light-adjusting members 30. It is preferable to include an ozone cleaning or plasma treatment of the light-adjusting member 30 after the light-adjusting end piece 33 is removed. Impurities such as organic compounds, etc., can be removed thereby. Even when a portion of the light-adjusting member 30 is yellowed by laser irradiation, at least a portion of the yellowed light-adjusting member 30 can be removed by performing ozone cleaning or plasma treatment of the light-adjusting member 30. The light extraction efficiency of the light-emitting module 102 is increased thereby. The light-emitting module 102 and the planar light source 302 shown in FIG. 4B can be manufactured by the processes described above. The method for manufacturing the light-emitting module 102 and the planar light source 302 described above is an example; and various modifications are possible within the limits of technical feasibility.

Figure 4B:
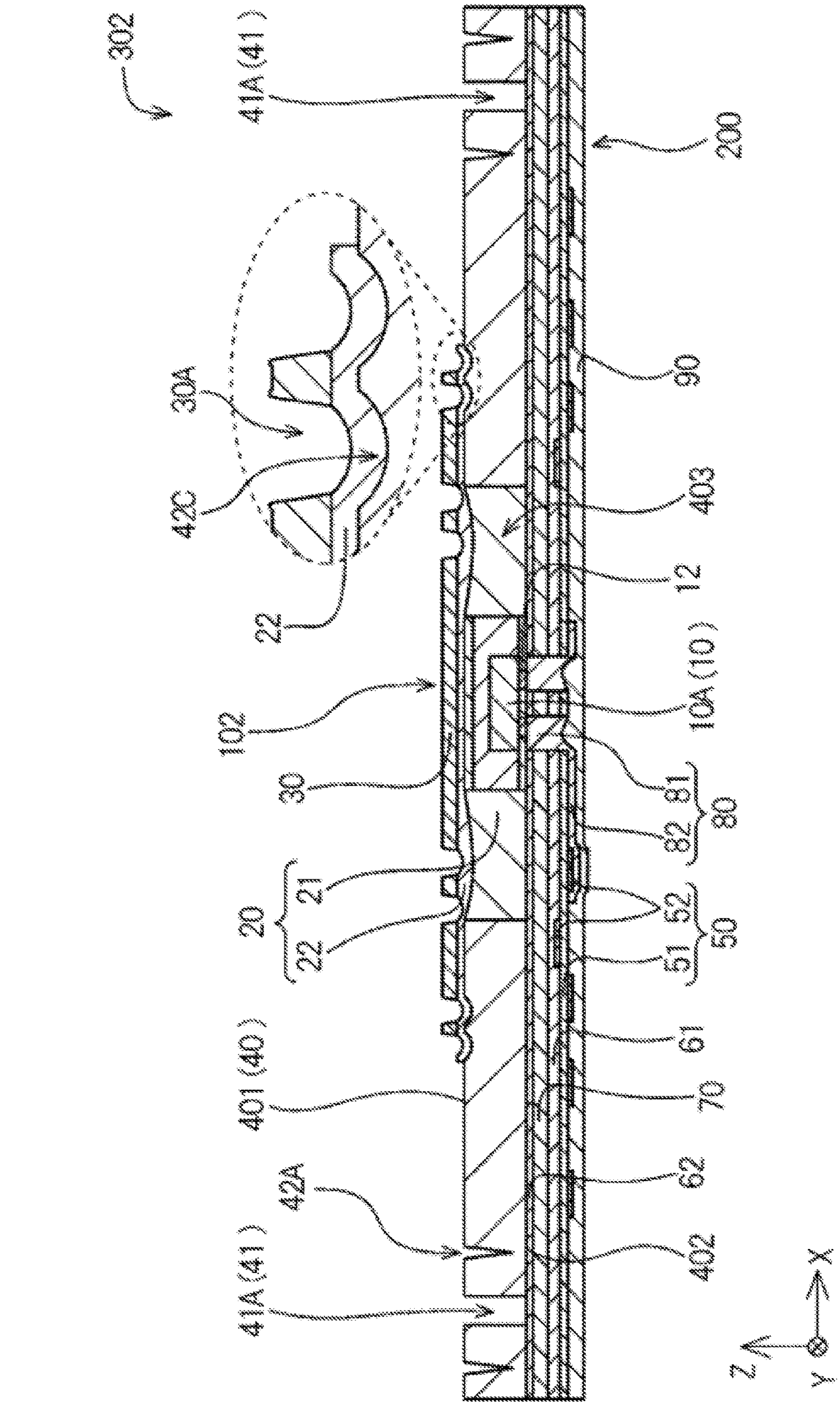
FIG. 4B is a schematic cross-sectional view of a modification of the planar light source according to the embodiment.
Figure 4C:
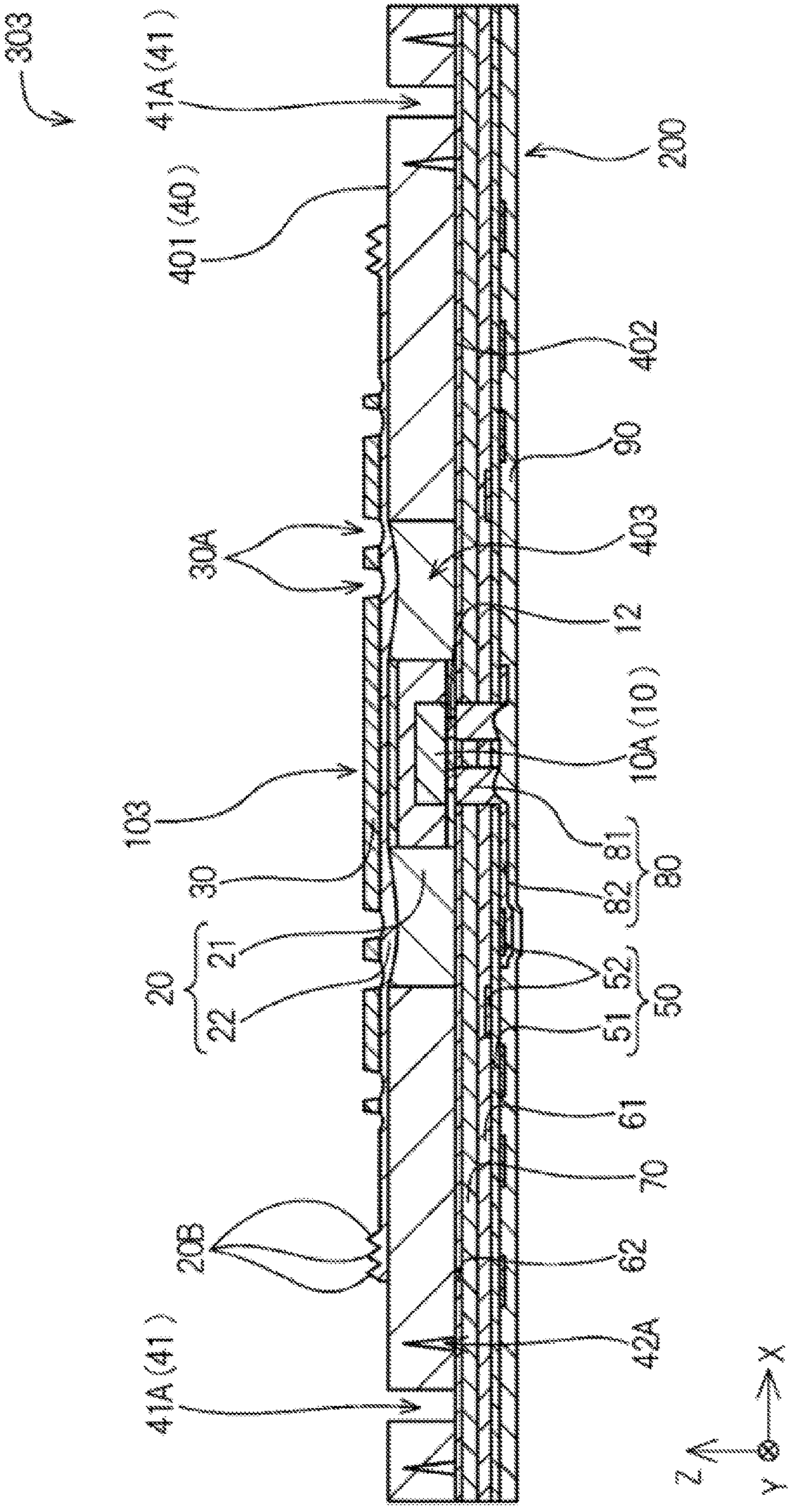
FIG. 4C is a schematic cross-sectional view of a modification of the planar light source according to the embodiment.
Figure 4D:
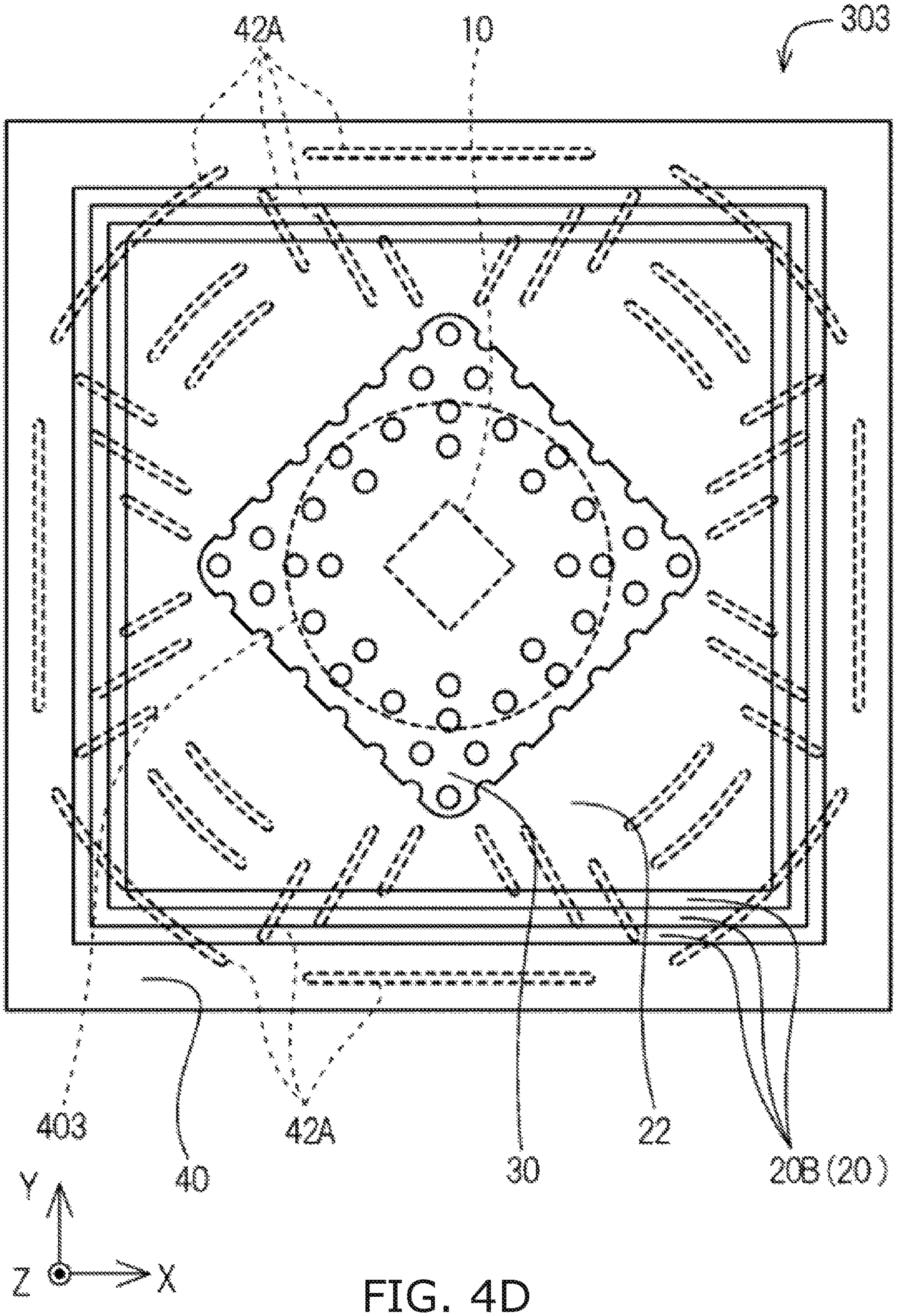
FIG. 4D is a schematic plan view of a modification of the planar light source according to the embodiment.
Figure 8:
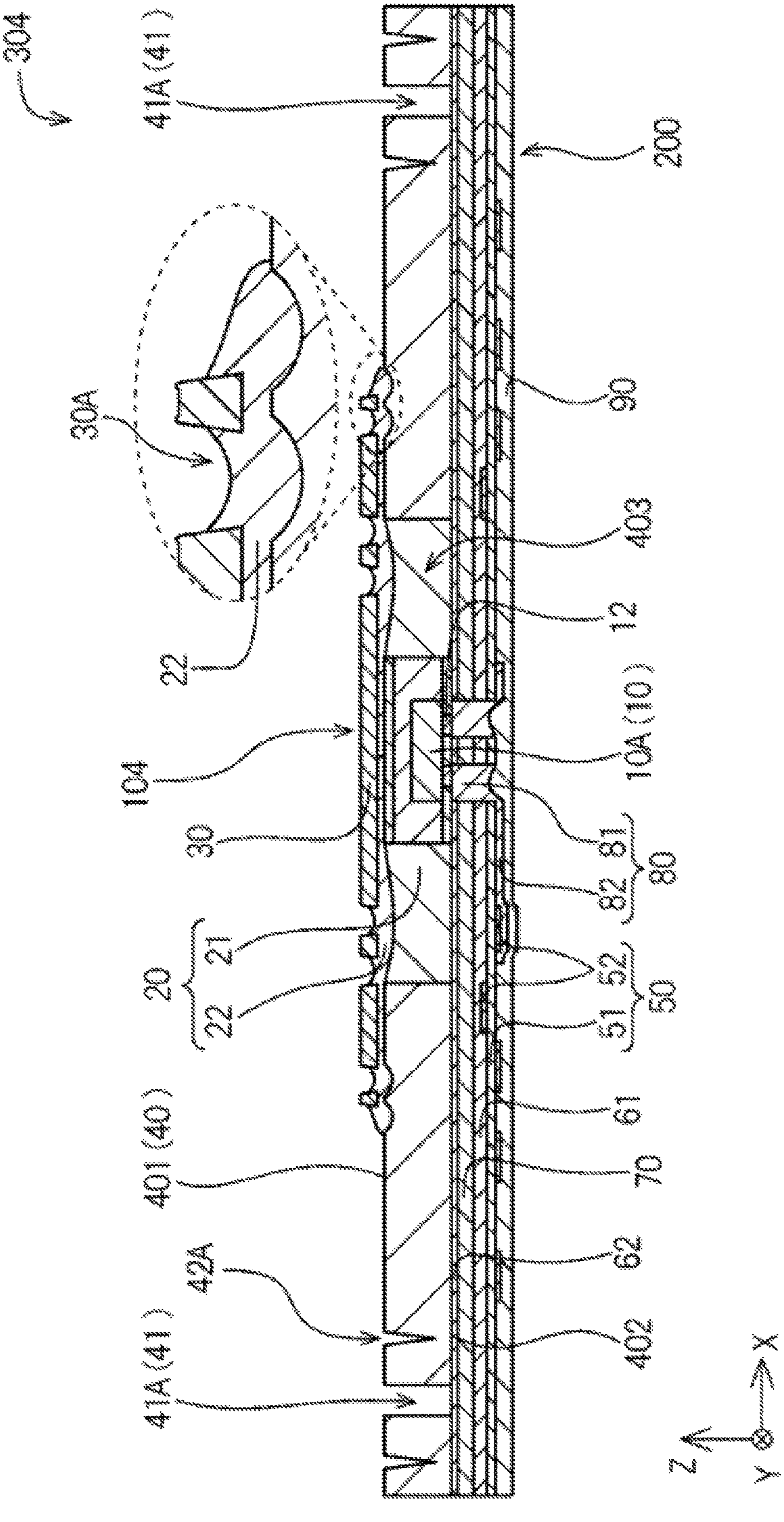
FIG. 8 is a schematic cross-sectional view of a modification of the planar light source according to the embodiment.

When a hot-melt resin is used as the material of the second light-transmitting part 22, at least a portion of the second light-transmitting part 22 may be melted further by heating after the light-emitting module 102 and the planar light source 302 shown in FIG. 4B are manufactured. As shown in FIG. 8, the second light-transmitting part 22 that contacts at least a portion of the surface of the light-adjusting member 30 defining the light-adjusting through-hole 30A can be formed by heating at least a portion of the second light-transmitting part 22 to become a liquid and then solidifying by cooling. The adhesion of the second light-transmitting part 22 and the light-adjusting member 30 can be improved thereby. For example, the at least a portion of the light-adjusting member 30 may sink into the liquid second light-transmitting part 22 due to the weight of the light-adjusting member 30. Alternatively, at least a portion of the light-adjusting member 30 may be caused to sink into the liquid second light-transmitting part 22 by pressing the light-adjusting member 30 downward. Although not particularly limited, the heating temperature of the hot-melt resin is, for example, not less than 70° C. The second light-transmitting part 22 may contact the entire surface of the light-adjusting member 30 defining the light-adjusting through-hole 30A. As shown in FIG. 8, the second light-transmitting part 22 may contact at least a portion of the lateral surface at the outer side of the light-adjusting member 30. The adhesion of the second light-transmitting part 22 and the light-adjusting member 30 can be improved thereby. The second light-transmitting part 22 may contact a portion of the upper surface of the light-adjusting member 30.

An example of a method for manufacturing the light-emitting module 103 and the planar light source 303 will now be described with reference to FIGS. 7M to 7O.

Figure 7M:
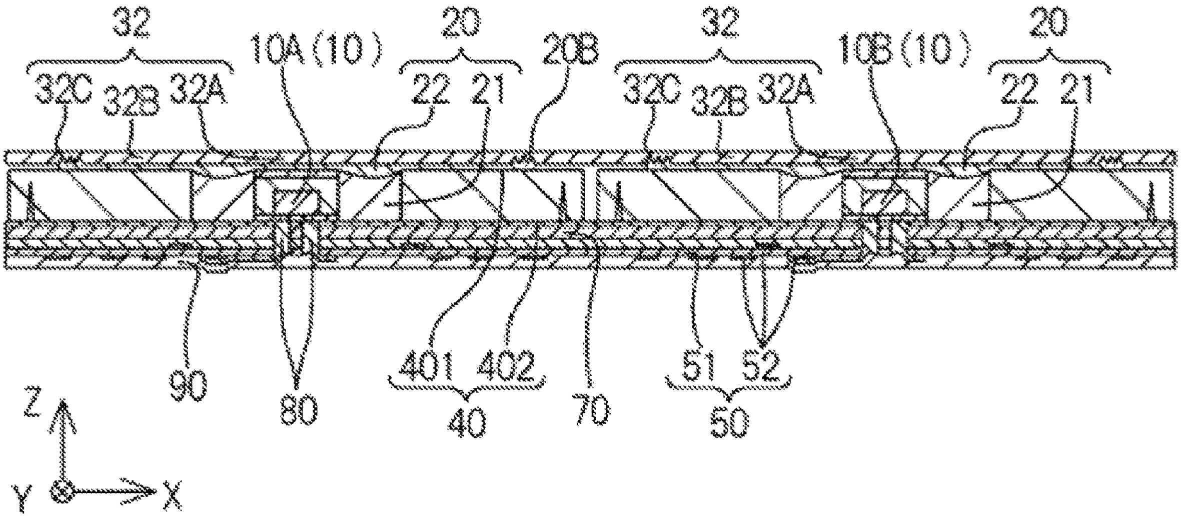
FIG. 7M is a schematic cross-sectional view showing a manufacturing method of a modification of the planar light source according to the embodiment.

As shown in FIG. 7M, an intermediate body that includes the light source part 10, the light-transmitting member 20 contacting the lateral surface of the light source part 10, and the light-adjusting intermediate member 32 positioned at the upper side of the light source part 10 and the light-transmitting member 20 is provided. The intermediate body may be provided by manufacturing by a method similar to an example of the method for manufacturing the light-emitting module 102 and the planar light source 302, or may be provided by assignment or the like including procurement.

Figure 7N:
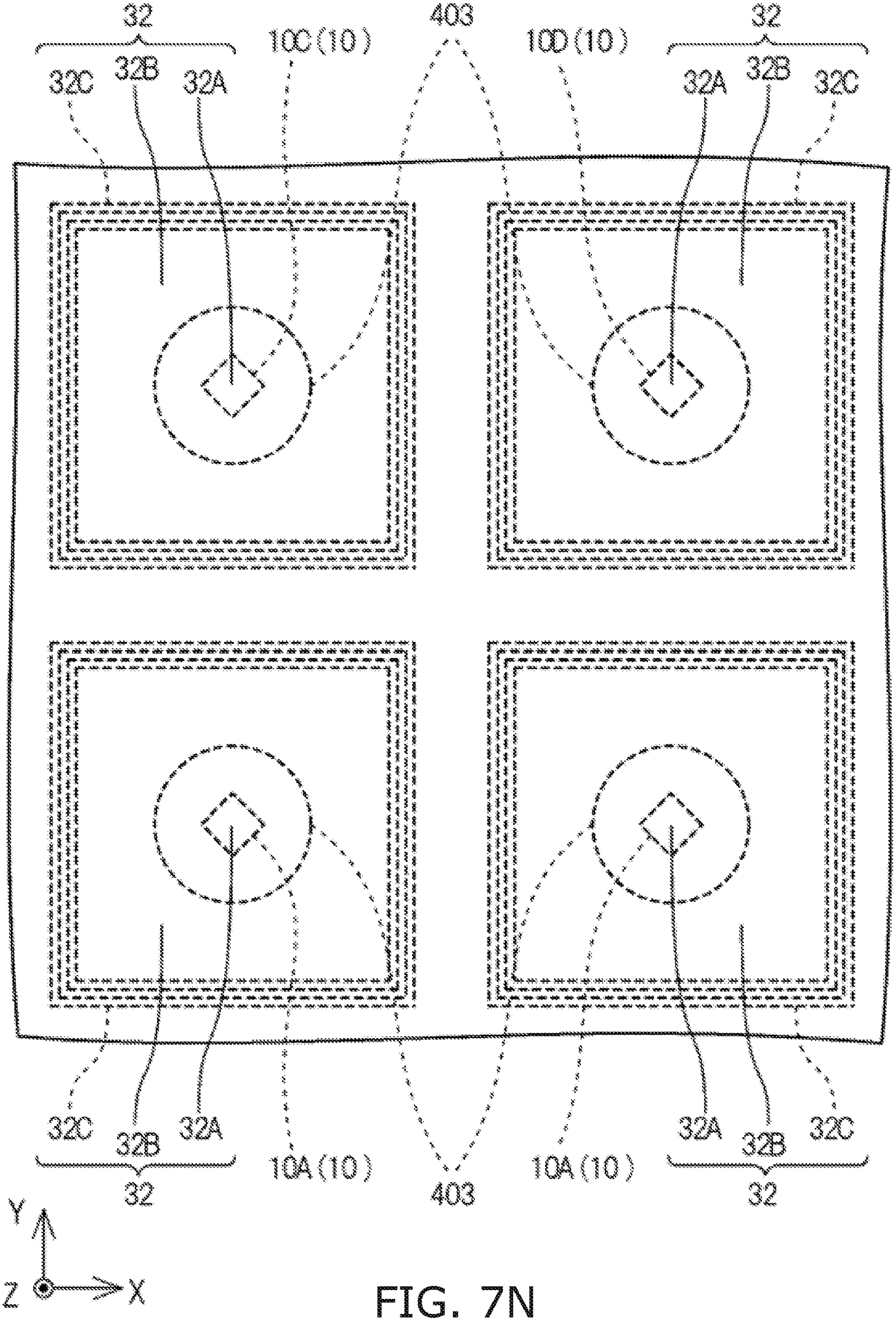
FIG. 7N is a schematic plan view showing the manufacturing method of the modification of the planar light source according to the embodiment.

As shown in FIG. 7N, the light-adjusting intermediate member 32 has a first region 32A overlapping the light source part 10 in a plan view, a second region 32B positioned away from the light source part 10 in a plan view, and a hole part 32C (hereinbelow, referred to as the light-adjusting hole part) positioned in the second region 32B. As shown in FIG. 7M, the light-adjusting hole part 32C is open at the surface facing the light-transmitting member 20. According to the embodiment, the light-adjusting hole part 32C is a recess open at only the surface facing the light-transmitting member 20. The light-adjusting hole part 32C may be a through-hole extending from the upper surface to the lower surface of the light-adjusting intermediate member 32. At least a portion of the surface of the light-adjusting intermediate member 32 defining the light-adjusting hole part 32C contacts the light-transmitting member 20.

By the light-adjusting intermediate member 32 including the light-adjusting hole part 32C, the variation of the size in the lateral direction of the second light-transmitting part 22 is more easily reduced. The uncured second light-transmitting part 22 also can wet and spread into the light-adjusting hole part 32C when disposing the light-adjusting intermediate member 32 at the upper side of the light source part and the first light-transmitting part 21 with the uncured second light-transmitting part 22 interposed. Thereby, the size of the wetting and spreading of the uncured second light-transmitting part 22 in the lateral direction is more easily adjusted by the light-adjusting hole part 32C. Therefore, by the light-adjusting intermediate member 32 having the light-adjusting hole part 32C, the variation of the size in the lateral direction of the second light-transmitting part 22 is more easily reduced. The light-transmitting protrusion 20B is formed of the second light-transmitting part 22 that wets and spreads into the light-adjusting hole part 32C.

Figure 7O:
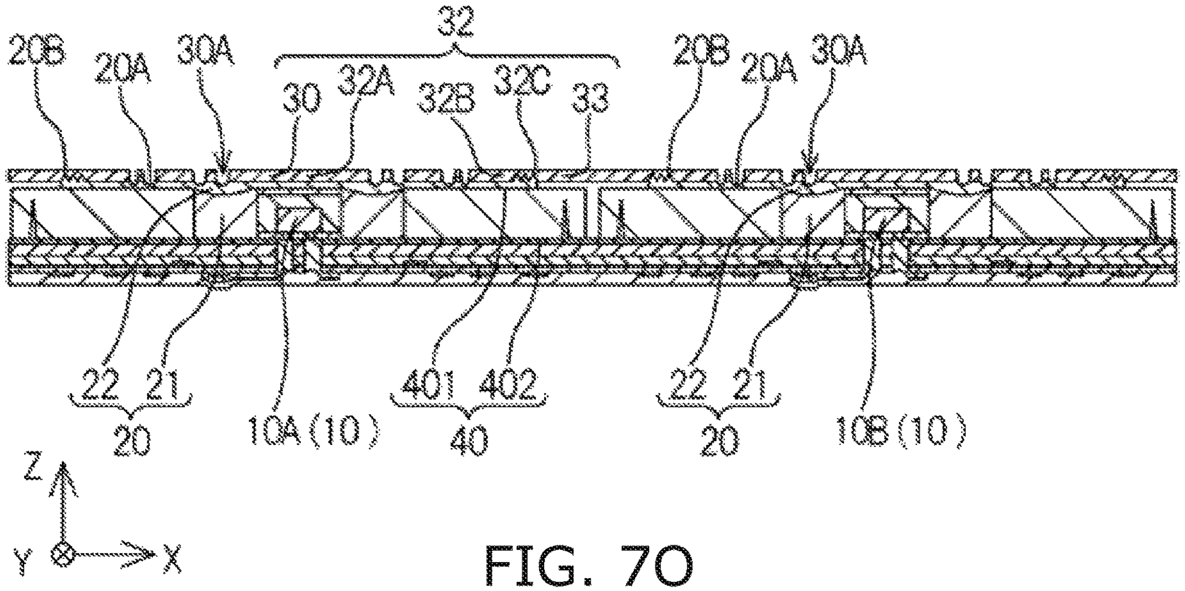
FIG. 7O is a schematic cross-sectional view showing a manufacturing method of a modification of the planar light source according to the embodiment.

After the process of providing the intermediate body, the light-adjusting through-hole 30A is formed in the light-adjusting intermediate member 32 as shown in FIG. 7O. The light-adjusting intermediate member 32 is singulated into the light-adjusting members 30 located at the upper sides of the light source parts 10. The singulation into the light-adjusting members 30 can be performed by forming through-holes in the light-adjusting intermediate member 32 by laser irradiation, etc. As shown in FIG. 7O, the light-adjusting intermediate member 32 is divided into the multiple light-adjusting members 30 located at the upper sides of the light source parts 10, and the light-adjusting end piece 33 positioned between the multiple light-adjusting members 30. At least a portion of the light-adjusting member 30 is positioned in the first region 32A of the light-adjusting intermediate member 32. At least a portion of the light-adjusting end piece 33 is positioned in the second region 32B of the light-adjusting intermediate member 32. The process of singulating into the light-adjusting members 30 may be performed after the process of forming the light-adjusting through-hole 30A, or the process of forming the light-adjusting through-hole 30A may be performed after the process of singulating into the light-adjusting members 30.

After the process of forming the light-adjusting through-hole 30A in the light-adjusting member 30, a portion of the second region 32B that is positioned at the outer side of the light-adjusting through-hole 30A and includes the light-adjusting through-hole 30A is removed. The removed portion of the second region 32B of the light-adjusting intermediate member 32 is positioned outward from the light-adjusting through-hole 30A. The removed portion of the second region 32B of the light-adjusting intermediate member 32 includes the light-adjusting through-hole 30A. The removed portion of the second region 32B of the light-adjusting intermediate member 32 is the same portion as the light-adjusting end piece 33. After the light-adjusting end piece 33 is removed, an ozone cleaning or plasma treatment of the light-adjusting member 30 may be performed. The light-emitting module 103 and the planar light source 303 shown in FIGS. 4C and 4D can be manufactured by the processes described above. The method for manufacturing the light-emitting module 103 and the planar light source 303 described above is an example; and various modifications are possible within the limits of technical feasibility.

According to embodiments, a light-emitting module and a method for manufacturing a light-emitting module can be provided in which uneven luminance can be reduced.

The specification includes the following embodiments.

Clause 1

A light-emitting module, comprising:

a light source part;

a light-transmitting member including a first light-transmitting part contacting a lateral surface of the light source part, and a second light-transmitting part positioned at an upper side of the light source part and the first light-transmitting part; and a light-adjusting member located at an upper side of the light source part, the first light-transmitting part, and the second light-transmitting part, the light-adjusting member having a through-hole positioned away from the light source part in a plan view, the light-transmitting member having a recess communicating with the through-hole, at least a portion of the recess being positioned lower than a lower surface of the light-adjusting member.

Clause 2

The light-emitting module according to Clause 1, wherein the light-adjusting member includes a resin member and a reflector, and a reflective index of the reflector is lower than a reflective index of the resin member.

Clause 3

The light-emitting module according to Clause 1 or Clause 2, wherein the light-adjusting member includes one or more additional through-holes in a plan view, and all of the through hole and the one or more additional through-holes are positioned away from the light source part in a plan view.

Clause 4

The light-emitting module according to any one of Clauses 1 to 3, wherein the through-hole includes a line-shaped portion in a plan view.

Clause 5

The light-emitting module according to any one of Clauses 1 to 4, further comprising:

a light guide member having a first surface, a second surface at a side opposite to the first surface, and a housing part extending from the first surface to the second surface, the light source part being located in the housing part.

Clause 6

The module according to Clause 5, wherein at least a portion of an outer edge of the light-adjusting member is positioned outward from an outer edge of the housing part in a plan view.

Clause 7

The light-emitting module according to Clause 5 or Clause 6, wherein the light guide member has a hole part that is open at the first surface side of the light guide member.

Clause 8

The light-emitting module according to Clause 7, wherein the second light-transmitting part contacts a surface of the light guide member defining the hole part.

Clause 9

A method for manufacturing a light-emitting module, the method comprising, in order:

providing an intermediate body, the intermediate body comprising, a light source part, a light-transmitting member contacting a lateral surface of the light source part, and a light-adjusting member positioned at an upper side of the light source part and the light-transmitting member; and forming a through-hole in the light-adjusting member, the through-hole being positioned away from the light source part in a plan view.

Clause 10

The method for manufacturing the light-emitting module according to Clause 9, wherein the forming of the through-hole includes forming the through-hole by laser irradiation.

Clause 11

The method for manufacturing the light-emitting module according to Clause 9 or Clause 10, wherein the forming of the through-hole includes forming a recess in the light-transmitting member, and the recess communicates with the through-hole.

Clause 12

The method for manufacturing the light-emitting module according to any one of Clauses 9 to 11, the method further comprising:

performing ozone cleaning or plasma treatment of the light-adjusting member after the forming of the through-hole.

Clause 13

The method for manufacturing the light-emitting module according to any one of Clauses 9 to 12, wherein in the providing of the intermediate body, the light-adjusting member includes, a first region overlapping the light source part in a plan view, a second region being positioned away from the light source part, and a hole part being positioned in the second region and being open at a surface of the light-adjusting member facing the light-transmitting member, and at least a portion of a surface of the light-adjusting member defining the hole part contacts the light-transmitting member, the method further comprises removing a portion of the second region positioned outward from the through-hole after the forming of the through-hole, and the portion of the second region includes the hole part.

Hereinabove, exemplary embodiments of the invention are described with reference to specific examples. However, the embodiments of the invention are not limited to these specific examples. All embodiments practicable by an appropriate design modification by one skilled in the art based on the exemplary embodiments of the invention described above also are within the scope of the invention to the extent that the purport of the invention is included. Various other variations and modifications can be conceived by those skilled in the art within the spirit of the invention, and it is understood that such variations and modifications are also encompassed within the scope of the invention.

What is claimed is:

1. A light-emitting module, comprising:

a light source part;

a light-transmitting member including a first light-transmitting part contacting a lateral surface of the light source part, and a second light-transmitting part positioned at an upper side of the light source part and the first light-transmitting part; and a light-adjusting member located at an upper side of the light source part, the first light-transmitting part, and the second light-transmitting part, the light-adjusting member having a through-hole positioned away from the light source part in a plan view, the light-transmitting member having a recess communicating with the through-hole, a maximum length of the recess in the lateral direction is less than a maximum length of the through-hole in the lateral direction in a cross-sectional view, at least a portion of the recess being positioned lower than a lower surface of the light-adjusting member, the recess overlaps the through-hole in the plan view, the recess is positioned away from the light source part in the plan view, and the light-adjusting member and the light source part overlap in a plan view.

2. The light-emitting module according to claim 1, wherein the light-adjusting member includes a resin member and a reflector, and a reflective index of the reflector is lower than a refractive index of the resin member.

3. The light-emitting module according to claim 1, wherein the light-adjusting member includes one or more additional through-holes in the plan view, and all of the through hole and the one or more additional through-holes are positioned away from the light source part in the plan view.

4. The light-emitting module according to claim 1, wherein the through-hole includes a line-shaped portion in the plan view.

5. The light-emitting module according to claim 1, further comprising:

a light guide member having a first surface, a second surface at a side opposite to the first surface, and a housing part extending from the first surface to the second surface, the light source part being located in the housing part.

6. The light-emitting module according to claim 5, wherein at least a portion of an outer edge of the light-adjusting member is positioned outward from an outer edge of the housing part in the plan view.

7. The light-emitting module according to claim 5, wherein the light guide member has a hole part open at a first surface side of the light guide member.

8. The light-emitting module according to claim 7, wherein the second light-transmitting part contacts a surface of the light guide member defining the hole part.

9. A method for manufacturing a light-emitting module, the method comprising, in order:

providing an intermediate body, the intermediate body comprising a light source part, a light-transmitting member contacting a lateral surface of the light source part, and a light-adjusting member positioned at an upper side of the light source part and the light-transmitting member; and forming a through-hole in the light-adjusting member, wherein the forming of the through-hole includes forming a recess in the light-transmitting member, and wherein the recess communicates with the through-hole, the through-hole is positioned away from the light source part in a plan view, the recess overlaps the through-hole in the plan view, the recess is positioned away from the light source part in the plan view, a maximum length of the recess in the lateral direction is less than a maximum length of the through-hole in the lateral direction in a cross-sectional view; and the light-adjusting member and the light source part overlap in a plan view.

10. The method according to claim 9, wherein the forming of the through-hole includes forming the through-hole by laser irradiation.

11. The method according to claim 9, the method further comprising performing ozone cleaning or a plasma treatment of the light-adjusting member after the forming of the through-hole.

12. The method according to claim 9, wherein in the providing of the intermediate body, the light-adjusting member includes a first region overlapping the light source part in the plan view, a second region being positioned away from the light source part in the plan view, and a hole part being positioned in the second region and being open at a surface of the light-adjusting member facing the light-transmitting member, and at least a portion of a surface of the light-adjusting member defining the hole part contacts the light-transmitting member, and wherein the method further comprises removing a portion of the second region positioned outward from the through-hole after the forming of the through-hole, and the portion of the second region includes the hole part.

* * * * *